(12) United States Patent  
Fujita

(10) Patent No.: US 9,029,954 B2
(45) Date of Patent: May 12, 2015

(54) SEMICONDUCTOR DEVICE AND MANUFACTURING METHOD THEREFOR

(71) Applicant: Panasonic Corporation, Osaka (JP)

(72) Inventor: Tomohiro Fujita, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 233 days.

(21) Appl. No.: 13/671,757

(22) Filed: Nov. 8, 2012

(65) Prior Publication Data

US 2013/0062700 A1 Mar. 14, 2013

Related U.S. Application Data

(63) Continuation of application No. PCT/JP2012/001339, filed on Feb. 28, 2012.

(30) Foreign Application Priority Data

Mar. 25, 2011 (JP) ................. 2011-067503

(51) Int. Cl.
*H01L 21/70* (2006.01)
*H01L 21/8238* (2006.01)
*H01L 29/49* (2006.01)
*H01L 29/51* (2006.01)
(Continued)

(52) U.S. Cl.
CPC .......................... *H01L 21/823842* (2013.01); *H01L 21/823857* (2013.01); *H01L 29/4966* (2013.01); *H01L 29/513* (2013.01); *H01L 29/517* (2013.01); *H01L 29/6659* (2013.01); *H01L 29/7833* (2013.01)

(58) Field of Classification Search
CPC ............... H01L 21/823842; H01L 21/823857; H01L 29/4966; H01L 29/7833; H01L 29/517; H01L 29/6659; H01L 29/513
USPC ............... 257/368, 401, 410, E27.06, E21.54
See application file for complete search history.

(56) References Cited

U.S. PATENT DOCUMENTS 7,838,908 B2 * 11/2010 Kwon et al. ................... 257/204
8,076,734 B2 * 12/2011 Zhu ............................... 257/401
(Continued)

FOREIGN PATENT DOCUMENTS

| JP | 2008-288465 | 11/2008 |
| JP | 2010-272596 | 12/2010 |

(Continued)

OTHER PUBLICATIONS

International Search Report of PCT Application No. PCT/JP2012/001339 dated May 29, 2012.

*Primary Examiner* — Fernando L Toledo
*Assistant Examiner* — Victoria K Hall
(74) *Attorney, Agent, or Firm* — Panasonic Patent Center

(57) ABSTRACT

A semiconductor device according to the present invention has an n-type MIS transistor. The n-type MIS transistor has a first active region surrounded by a device isolation region in a semiconductor substrate, a first gate insulating film having a first high-dielectric-constant insulating film containing a first metal for adjustment, and a first electrode formed on the first gate insulating film. A protrusion amount of one end of the first high-dielectric-constant insulating film on the first device isolation part is smaller than a protrusion amount of an end of the first gate electrode above the first device isolation part.

20 Claims, 10 Drawing Sheets

(51) Int. Cl.
*H01L 29/66* (2006.01)
*H01L 29/78* (2006.01)

(56) References Cited

U.S. PATENT DOCUMENTS

| | | | | |
|---|---|---|---|---|
| 8,551,832 | B2* | 10/2013 | Akiyama et al. | 438/199 |
| 2008/0283928 | A1 | 11/2008 | Sato et al. | |
| 2009/0152650 | A1* | 6/2009 | Chudzik et al. | 257/410 |
| 2010/0187610 | A1* | 7/2010 | Kwon et al. | 257/369 |
| 2011/0227171 | A1* | 9/2011 | Chudzik et al. | 257/411 |
| 2012/0056268 | A1* | 3/2012 | Mizutani et al. | 257/369 |
| 2013/0020654 | A1* | 1/2013 | Yamada et al. | 257/369 |
| 2013/0049135 | A1* | 2/2013 | Moriyama | 257/392 |
| 2013/0154021 | A1* | 6/2013 | Chuang et al. | 257/369 |

FOREIGN PATENT DOCUMENTS

| | | |
|---|---|---|
| JP | 2011-165873 | 8/2011 |
| JP | 2012-038800 | 2/2012 |

* cited by examiner

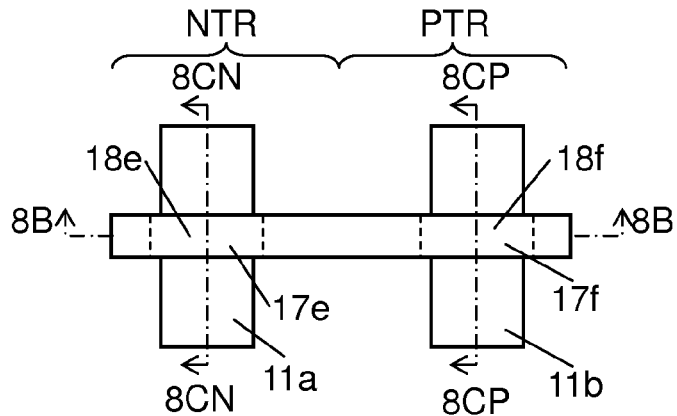
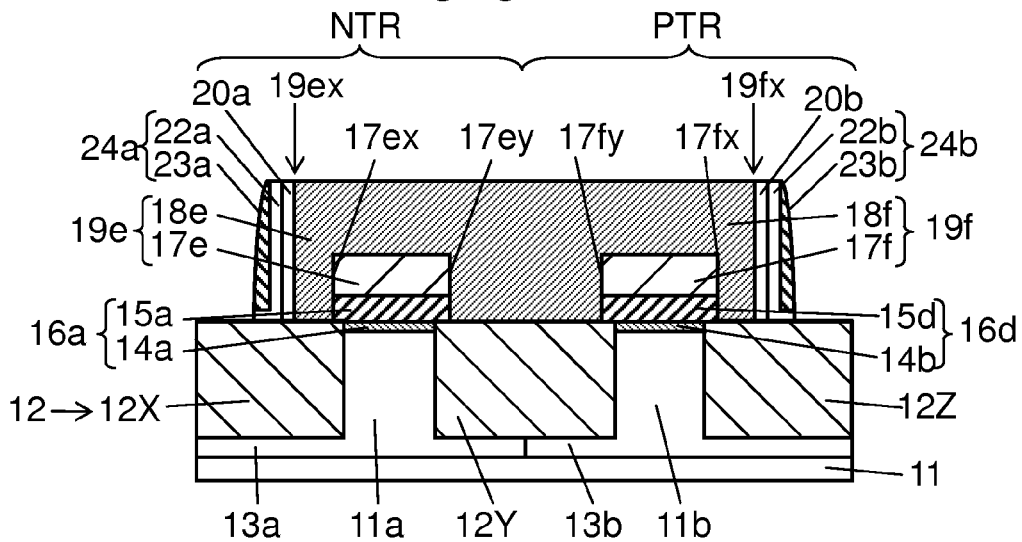
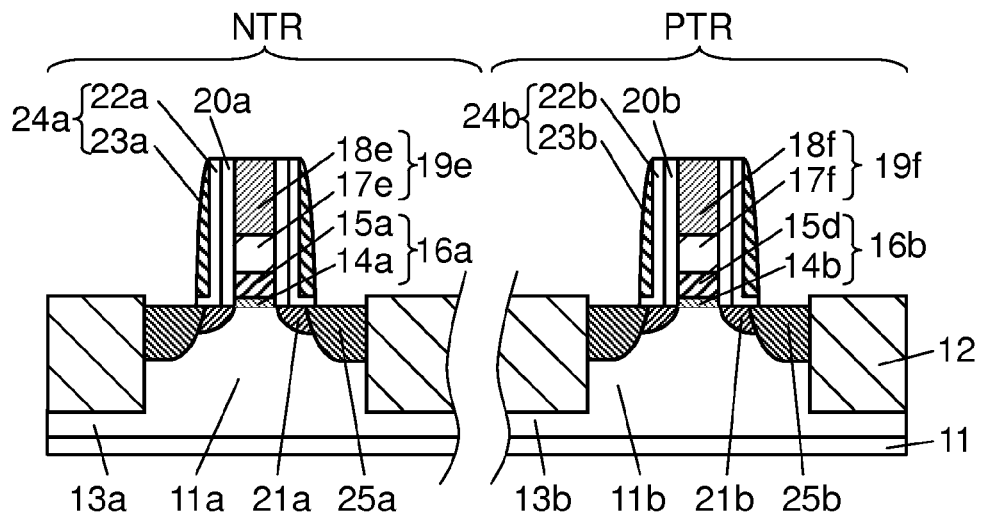

US 9,029,954 B2

SEMICONDUCTOR DEVICE AND MANUFACTURING METHOD THEREFOR

This application is a Bypass-continuation application of PCT international application PCT/JP2012/001339 filed on Feb. 28, 2012, which claims priority to Japanese Patent Application No. 2011-067503 filed on Mar. 25, 2011. The disclosures of these applications including the specifications, the drawings, and the claims are hereby incorporated by reference in its entirety.

1. TECHNICAL FIELD

The present invention relates to a semiconductor device and a method of manufacturing the same and, more particularly, to a semiconductor device having a MISFET (Metal-Insulator-Semiconductor Field-Effect Transistor) provided with a gate insulating film having a high-dielectric-constant insulating film and a method of manufacturing the same.

2. BACKGROUND ART

Conventionally, as an LSI (Large Scale Integrated circuit) is realizing higher integration and higher speed, the size of a MISFET (hereinbelow, called "MIS transistor") is being reduced. A reduction in the thickness of a gate insulating film is being demanded in accordance with the miniaturization of the MIS transistor.

In recent years, therefore, to reduce EOT (Equivalent Oxide Thickness) of the gate insulating film without increasing leak current from a gate, a method of using, as the gate insulating film, a high-dielectric-constant insulating film in place of a conventional silicon oxide film and a silicon nitride film is proposed. The "high-dielectric-constant insulating film" is an insulating film made of a dielectric having relative permittivity higher than that of silicon oxide and silicon oxynitride. An example of the dielectric is a metal oxide containing hafnium (Hf).

In the case of using a high-dielectric-constant insulating film as a gate insulating film and using only a conventional polysilicon film as a gate electrode, the threshold voltage of an MIS transistor cannot be sufficiently lowered. There is consequently a proposed technique of using, as a gate insulating film, a high-dielectric-constant insulating film containing metal such as lanthanum (La) or aluminum (Al) for adjusting threshold voltage and using, as a gate electrode, a metal containing film or a stack film of a metal containing film and a silicon film (refer to, for example, PTL 1). In the case of an n-type MIS transistor, by using an Hf-based film containing La as a gate insulating film, the threshold voltage of an n-type MIS transistor can be lowered. On the other hand, in the case of a p-type MIS transistor, by using an Hf-based film containing Al as a gate insulating film, the threshold voltage of a p-type MIS transistor can be lowered.

The configuration of a conventional semiconductor device will be described below with reference to FIGS. 10A to 10C. FIG. 10A is a plan view showing the configuration of the conventional semiconductor device. FIG. 10B is a cross section in the gate width direction showing the configuration of the conventional semiconductor device. FIG. 10C is a cross section in the gate length direction showing the configuration of the conventional semiconductor device. Specifically, FIG. 10B is a cross section taken along ling 10B-10B shown in FIG. 10A. The left side (NTR) in FIG. 10C is a cross section taken along line 10CN-10CN shown in FIG. 10A. The right side (PTR) in FIG. 10C is a cross section taken along line 10CP-10CP shown in FIG. 10A. In FIG. 10A, only an active region, a high-dielectric-constant insulating film in a gate insulating film, and a silicon film in a gate electrode are illustrated and the other components are not shown.

As shown in FIGS. 10A to 10C, the conventional semiconductor device has an n-type MIS transistor and a p-type MIS transistor.

The n-type MIS transistor has p-type well region 103a formed in the n-type transistor region NTR in semiconductor substrate 101, and active region 101a surrounded by device isolation region 102 in semiconductor substrate 101 (p-type well region 103a). The n-type MIS transistor has gate insulating film 106a formed on active region 101a and device isolation region 102 and gate electrode 109a formed on gate insulating film 106a. The n-type MIS transistor has n-type extension regions 110a formed below the sides of gate electrode 109a in active region 101a and sidewalls 111a formed on the side faces of gate electrode 109a. The n-type MIS transistor has n-type source drain regions 112a formed below the outer sides of the sidewalls 111a in active region 101a.

Gate insulating film 106a has silicon oxide film 104a and high-dielectric-constant insulating film 105a containing La. Gate electrode 109a has titanium nitride film (TiN film) 107a and polysilicon film 108a.

The p-type MIS transistor has n-type well region 103b formed in the p-type transistor region PTR in semiconductor substrate 101, and active region 101b surrounded by device isolation region 102 in semiconductor substrate 101 (n-type well region 103b). The p-type MIS transistor has gate insulating film 106b formed on active region 101b and device isolation region 102 and gate electrode 109b formed on gate insulating film 106b. The p-type MIS transistor has p-type extension regions 110b formed below the sides of gate electrode 109b in active region 101b and sidewalls 111b formed on the side faces of gate electrode 109b. The p-type MIS transistor has p-type source drain regions 112b formed below the outer sides of sidewalls 111b in active region 101b.

Gate insulating film 106b has silicon oxide film 104b and high-dielectric-constant insulating film 105b containing Al. Gate electrode 109b has TiN film 107b and polysilicon film 108b.

The n-type MIS transistor and the p-type MIS transistor construct a CMIS (Complementary Metal Insulator Semiconductor) transistor having dual gate electrodes. Active regions 101a and 101b are isolated from each other while sandwiching the device isolation part therebetween. Gate electrodes 109a and 109b are connected to each other and integrally formed above the device isolation part. The "device isolation part" is a part positioned between active regions 101a and 101b in device isolation region 102.

As shown in FIG. 10B, one side face 105ax in the gate width direction of high-dielectric-constant insulating film 105a matches the side face in the gate width direction of gate electrode 109a. Other side face 105ay in the gate width direction of high-dielectric-constant insulating film 105a is positioned above the center of the device isolation part.

CITATION LIST

Patent Literature

PTL 1: Unexamined Japanese Patent Publication No. 2010-272596

SUMMARY

An n-type MIS transistor has a gate insulating film having a high-dielectric-constant insulating film containing a metal such as La for adjusting threshold voltage (hereinbelow, called "n-type metal for adjustment"). A p-type MIS transistor has a gate insulating film having a high-dielectric-constant insulating film containing a metal such as Al for adjusting threshold voltage (hereinbelow, called "p-type metal for adjustment"). The inventors of the present invention have earnestly examined each of the n-type MIS transistor and the p-type MIS transistor and, as a result, found out the followings.

As the size of a semiconductor device is decreasing, the gate width has to be narrowed. However, in the case of an n-type MIS transistor, a problem occurs such that, as the gate width decreases, the threshold voltage of the n-type MIS transistor becomes higher. On the other hand, in the case of a p-type MIS transistor, although the threshold voltage of the p-type MIS transistor becomes slightly higher as the gate width decreases, the degree that the threshold voltage becomes higher is lower than that in the n-type MIS transistor, and it is not so regarded as a problem.

In a semiconductor device having an n-type MIS transistor including a gate insulating film having a high-dielectric-constant insulating film containing an n-type metal for adjustment, even when the gate width becomes narrower, the present invention prevents the threshold voltage of the n-type MIS transistor from becoming higher.

The inventor of the present invention has earnestly studied about the cause why the threshold voltage of the n-type MIS transistor becomes higher as the gate width becomes narrower in the case of the n-type MIS transistor including the gate insulating film having the high-dielectric-constant insulating film containing the n-type metal for adjustment and, as a result, obtained the following finding.

At the time of a heat treatment (such as a heat treatment for activating impurity contained in a source-drain implantation region) performed after formation of a high-dielectric-constant insulating film, oxygen (for example, oxygen contained in a device isolation region or the like) is diffused into a high-dielectric-constant insulating film containing La and a high-dielectric-constant insulating film containing Al and reacts with La and Al.

Specifically, in the case of an n-type MIS transistor, as shown in FIG. 10B, high-dielectric-constant insulating film 105a is formed in contact with device isolation region 102. Due to this, at the time of a heat treatment, oxygen contained in device isolation region 102 is diffused into high-dielectric-constant insulating film 105a via a part of high-dielectric-constant insulating film 105a which is in contact with device isolation region 102, and reacts with La contained in high-dielectric-constant insulating film 105a.

In the case of a p-type MIS transistor, as shown in FIG. 10B, high-dielectric-constant insulating film 105b is formed in contact with device isolation region 102. Due to this, at the time of a heat treatment, oxygen contained in device isolation region 102 is diffused into high-dielectric-constant insulating film 105b via a part of high-dielectric-constant insulating film 105b which is in contact with device isolation region 102, and reacts with Al contained in high-dielectric-constant insulating film 105b.

An amount of oxygen diffusing into the high-dielectric-constant insulating film containing La depends on the contact area in which the high-dielectric-constant insulating film containing La is in contact with the device isolation region. As the contact area becomes larger, the oxygen diffusion amount increases. Similarly, an oxygen diffusion amount of diffusion into the high-dielectric-constant insulating film containing Al depends on the contact area in which the high-dielectric-constant insulating film containing Al is in contact with the device isolation region. As the contact area becomes larger, the oxygen diffusion amount increases.

Oxygen is diffused more easily into the high-dielectric-constant insulating film containing La than the high-dielectric-constant insulating film containing Al for the following reason.

A standard free energy of formation of La oxide is −322 kcal, and that of Al oxide is −267 kcal. As described above, the standard free energy of formation of La oxide is negatively larger than that of Al oxide. As understood from the fact, La reacts with oxygen as compared with Al. Therefore, oxygen is diffused more easily into the high-dielectric-constant insulating film containing La than the high-dielectric-constant insulating film containing Al. The "standard free energy of formation of La oxide (or Al oxide)" denotes a change amount in free energy at the time of generating La oxide (or Al oxide) from La (Al). That is, it denotes a change amount obtained by subtracting the free energy of La (or Al) before reaction from the free energy of La oxide (or Al oxide) after the reaction.

Therefore, the diffusion amount of oxygen diffused into the high-dielectric-constant insulating film containing La is larger than that of oxygen diffused into the high-dielectric-constant insulating film containing Al.

When oxygen is diffused into the high-dielectric-constant insulating film containing La and reacts with La, the threshold voltage of the n-type MIS transistor increases.

Specifically, in the case of an n-type MIS transistor, at the time of a heat treatment, oxygen contained in device isolation region 102 is diffused into high-dielectric-constant insulating film 105a via a part of high-dielectric-constant insulating film 105a which is in contact with device isolation region 102, and reacts with La contained in high-dielectric-constant insulating film 105a. By the reaction, a part positioned around device isolation region 102, in the part formed on active region 101a, of gate insulating film 106a (hereinbelow, called "active region corresponding part") enters a negatively-charged state. In other words, both ends in the gate width direction in the active region corresponding part enter a negatively-charged state. Accordingly, holes are induced in a part just below a negatively-charged part in gate insulating film 106a, in the surface of active region 101a, in other words, in the both ends in the gate width direction in the surface of active region 101a. As a result, the threshold voltage in the part in which the holes are induced in the n-type MIS transistor becomes locally high and, moreover, the threshold voltage of the entire n-type MIS transistor becomes higher.

As the gate width becomes narrower, the proportion of the negatively-charged part in the active region corresponding part (negatively-charge part/active region corresponding part) becomes higher. In other words, the proportion of the part in which holes are induced in the surface of active region 101a (part in which holes are induced/surface of active region 101a) becomes higher. Consequently, the threshold voltage of the n-type MIS transistor becomes higher. The "gate width" denotes width in the gate width direction of the surface of active region 101a.

In the case of a p-type MIS transistor, at the time of a heat treatment, oxygen contained in device isolation region 102 is diffused into high-dielectric-constant insulating film 105b via a part of high-dielectric-constant insulating film 105b which is in contact with device isolation region 102, and reacts with Al contained in high-dielectric-constant insulating film 105b. However, the diffusion amount of oxygen diffused into the high-dielectric-constant insulating film containing La is larger than that of oxygen diffused into the high-dielectric-constant insulating film containing Al. In other words, in the case of the p-type MIS transistor, the diffusion amount of oxygen diffused into the high-dielectric-constant insulating film is smaller than that in the case of the n-type MIS transistor. Consequently, although the threshold voltage of the p-type MIS transistor becomes slightly higher, the degree that the threshold voltage becomes higher is lower than that in the n-type MIS transistor.

The present invention has been achieved on the basis of the above-described findings of the inventor of the present invention. Specifically, the semiconductor device according to the present invention is a semiconductor device having an n-type MIS transistor. The n-type MIS transistor has a first active region surrounded by a device isolation region in a semiconductor substrate. The n-type MIS transistor has a first gate insulating film formed on the first active region and on the device isolation region and having a first high-dielectric-constant insulating film containing a first metal for adjustment. The n-type MIS transistor has a first gate electrode formed on the first gate insulating film. The first high-dielectric-constant insulating film has one end protruding on a first device isolation part in the device isolation region adjacent to one end in the gate width direction of the first active region. One side face in the gate width direction of the first high-dielectric-constant insulating film is positioned on the first device isolation part. The first gate electrode has an end protruding above the first device isolation part. A protrusion amount of the one end of the first high-dielectric-constant insulating film on the first device isolation part is smaller than a protrusion amount of the end of the first gate electrode above the first device isolation part.

With the configuration, the protrusion amount of the first high-dielectric-constant insulating film on the device isolation region can be decreased, so that the contact area in which the first high-dielectric-constant insulating film is in contact with the device isolation region can be made smaller than that of a conventional n-type MIS transistor. Consequently, the oxygen diffusion amount of diffusing the oxygen contained in the device isolation region into the first high-dielectric-constant insulating film can be decreased. Therefore, even when the gate width becomes narrower as the size of the semiconductor device is becoming smaller, the threshold voltage of the n-type MIS transistor can be prevented from becoming higher.

In the semiconductor device according to the present invention, preferably, the first metal for adjustment is lanthanum.

More preferably, the following configuration is employed. Specifically, in the semiconductor device according to the present invention, the protrusion amount of the one end of the first high-dielectric-constant insulating film on the first device isolation part is in a range between 10 nm and 50 nm. The protrusion amount of the end of the first gate electrode above the first device isolation part is in a range between 60 nm and 150 nm.

More preferably, the following configuration is employed. Specifically, the semiconductor device according to the present invention further includes a p-type MIS transistor. The p-type MIS transistor has a second active region surrounded by the device isolation region in the semiconductor substrate and provided in a state that a second device isolation part in the device isolation region adjacent to the other end in the gate width direction of the first active region is sandwiched between the first active region and the second active region. The p-type MIS transistor has a second gate insulating film formed on the second active region and the device isolation region and having a second high-dielectric-constant insulating film containing a second metal for adjustment. The p-type MIS transistor has a second gate electrode formed on the second gate insulating film. The first and second gate electrodes are connected to each other above the second device isolation part.

In the semiconductor device according to the present invention, preferably, the second metal for adjustment is aluminum.

More preferably, the following configuration is employed. Specifically, in the semiconductor device according to the present invention, the first high-dielectric-constant insulating film has another end protruding on the second device isolation part. The other side face in the gate width direction of the first high-dielectric-constant insulating film is positioned on the second device isolation part. A distance from the other end in the gate width direction of the first active region to the other side face in the gate width direction of the first high-dielectric-constant insulating film is smaller than a distance from the other end in the gate width direction of the second active region to the other side face in the gate width direction of the first high-dielectric-constant insulating film.

In such a manner, the protrusion amount of the other end of the first high-dielectric-constant insulating film on the second device isolation part can be made smaller than the distance from the other end in the gate width direction of the first active region to the center of the second device isolation part. Therefore, the protrusion amount of the first high-dielectric-constant insulating film on the device isolation region can be further decreased.

More preferably, in the semiconductor device according to the present invention, a protrusion amount of the other end of the first high-dielectric-constant insulating film on the second device isolation part is the same (or "almost the same") as a protrusion amount of the one end of the first high-dielectric-constant insulating film on the first device isolation part.

More preferably, the following configuration is employed. That is, in the semiconductor device according to the present invention, the second high-dielectric-constant insulating film has a first part. The first part is formed on the second device isolation part, the second active region, and a third device isolation part in the device isolation region adjacent to one end in the gate width direction of the second active region. The first part is adjacent to the other end of the first high-dielectric-constant insulating film on the second device isolation part.

More preferably, the following configuration is employed. Specifically, in the semiconductor device according to the present invention, the second high-dielectric-constant insulating film has a second part. The second part is formed between the first device isolation part and the end of the first gate electrode. The second part is adjacent to the one end of the first high-dielectric-constant insulating film on the first device isolation part.

More preferably, the following configuration is employed. Specifically, in the semiconductor device according to the present invention, the first gate electrode has a metal containing film formed on the first gate insulating film and a silicon film formed on the metal containing film. A protrusion amount of an end of the metal containing film above the first device isolation part and a protrusion amount of an end of the silicon film above the first device isolation part are the same (or "about the same").

More preferably, the following configuration is employed. Specifically, in the semiconductor device according to the present invention, the second high-dielectric-constant insulating film has one end protruding on a third device isolation part in the device isolation region adjacent to one end in the gate width direction of the second active region. The second gate electrode has an end protruding on the third device isolation part. A protrusion amount of the one end of the second high-dielectric-constant insulating film on the third device isolation part is smaller than a protrusion amount of the end of the second gate electrode on the third device isolation part.

In such a manner, the protrusion amount of the second high-dielectric-constant insulating film on the device isolation region can be decreased, so that the contact area in which the second high-dielectric-constant insulating film is in contact with the device isolation region can be made smaller than that of the conventional p-type MIS transistor. Consequently, the oxygen diffusion amount of diffusing oxygen contained in the device isolation region into the second high-dielectric-constant insulating film can be decreased. Therefore, the threshold voltage of the p-type MIS transistor can be prevented from becoming slightly higher.

More preferably, the following configuration is employed. Specifically, in the semiconductor device according to the present invention, the first high-dielectric-constant insulating film has an other end part protruding on the second device isolation part. The second high-dielectric-constant insulating film has an other end part protruding on the second device isolation part adjacent to the other end in the gate width direction of the second active region. The other end part in the first high-dielectric-constant insulating film and the other end part in the second high-dielectric-constant insulating film are apart from each other on the second device isolation part.

More preferably, in the semiconductor device according to the present invention, the first gate electrode is formed so as to cover the top face of the first high-dielectric-constant insulating film and the one side face in the gate width direction of the first high-dielectric-constant insulating film, and the one side face in the gate width direction of the first high-dielectric-constant insulating film is in contact with the first gate electrode.

More preferably, the following configuration is employed. Specifically, in the semiconductor device according to the present invention, the first gate electrode has a metal containing film formed on the first gate insulating film and a silicon film formed on the metal containing film. A protrusion amount of an end of the metal containing film above the first device isolation part and a protrusion amount of an end of the silicon film above the first device isolation part are the same (or almost the same). The metal containing film is formed so as to cover the top face of the first high-dielectric-constant insulating film and the one side face in the gate width direction of the first high-dielectric-constant insulating film. The one side face in the gate width direction of the first high-dielectric-constant insulating film is in contact with the metal containing film.

More preferably, the following configuration is employed. Specifically, in the semiconductor device according to the present invention, the first gate electrode has a metal containing film formed on the first gate insulating film and a silicon film formed on the metal containing film. A protrusion amount of an end of the metal containing film above the first device isolation part is smaller than a protrusion amount of an end of the silicon film above the first device isolation part.

More preferably, in the semiconductor device according to the present invention, a protrusion amount of the end of the metal containing film above the first device isolation part and a protrusion amount of the one end of the first high-dielectric-constant insulating film above the first device isolation part are the same (or "about the same").

More preferably, the following configuration is employed. That is, in the semiconductor device according to the present invention, the silicon film is formed so as to cover the top face of the metal containing film, one side face of the metal containing film positioned above the first device isolation part, and the one side face in the gate width direction of the first high-dielectric-constant insulating film. The one side face in the gate width direction of the first high-dielectric-constant insulating film and the one side face in the gate width direction of the metal containing film are in contact with the silicon film.

More preferably, the following configuration is employed. Specifically, in the semiconductor device according to the present invention, the first gate electrode has a first metal containing film formed on the first gate insulating film and a first silicon film formed on the first metal containing film. The second gate electrode has a second metal containing film formed on the second gate insulating film and a second silicon film formed on the second metal containing film. The first and second silicon films are connected to each other and integrally formed above the second device isolation part. The first and second metal containing films are not connected to each other but are apart from each other above the second device isolation part.

A method of manufacturing a semiconductor device according to the present invention is a method of manufacturing a semiconductor device including an n-type MIS transistor having a first gate electrode formed above a first active region in a semiconductor substrate via a first gate insulating film. The semiconductor device manufacturing method includes a step (a) of forming the first active region surrounded by a device isolation region in the semiconductor substrate. The semiconductor device manufacturing method has a step (b) of forming the first gate insulating film having a first high-dielectric-constant insulating film containing a first metal for adjustment, on the first active region and the device isolation region. The semiconductor device manufacturing method has a step (c) of forming the first gate electrode on the first gate insulating film. In the step (b), the first high-dielectric-constant insulating film has one end protruding on a first device isolation part in the device isolation region adjacent to one end in the gate width direction of the first active region. In the step (c), the first gate electrode has an end protruding above the first device isolation part. A protrusion amount of the one end of the first high-dielectric-constant insulating film on the first device isolation part is smaller than a protrusion amount of the end of the first gate electrode above the first device isolation part.

In such a manner, the protrusion amount of the first high-dielectric-constant insulating film on the device isolation region can be decreased, so that the contact area in which the first high-dielectric-constant insulating film is in contact with the device isolation region can be made smaller than that of the conventional n-type MIS transistor. Consequently, at the time of a heat treatment (such as a heat treatment for activating impurity contained in a source-drain implantation region) performed after formation of the first high-dielectric-constant insulating film, amount of oxygen contained in the device isolation region and diffused into the first high-dielectric-constant insulating film can be reduced. Therefore, even when the size of the semiconductor device decreases and the gate width becomes narrower, the threshold voltage of the n-type MIS transistor can be prevented from becoming higher.

More preferably, the following configuration is employed. That is, in the method of manufacturing a semiconductor device according to the present invention, the semiconductor device further has a p-type MIS transistor having a second gate electrode formed above a second active region in the semiconductor substrate via a second gate insulating film. The step (a) includes a step of forming the second active region surrounded by the device isolation region in the semiconductor substrate and provided in a stated that a second device isolation part in the device isolation region adjacent to the other end in the gate width direction of the first active region is sandwiched between the first active region and the second active region. The step (b) includes a step of forming the second gate insulating film having a second high-dielectric-constant insulating film containing a second metal for adjustment, on the second active region and on the device isolation region. The step (c) includes a step of forming the second gate electrode on the second gate insulating film. In the step (c), the first and second gate electrodes are connected to each other above the second device isolation part.

In the semiconductor device and the method of manufacturing the same according to the present invention, even when the gate width is narrowed as the size of the semiconductor device decreases, the threshold voltage of the n-type MIS transistor can be prevented from becoming higher.

BRIEF DESCRIPTION OF DRAWINGS

FIG. 8A is a plan view showing the configuration of a semiconductor device according to a third exemplary embodiment of the present invention.

FIG. 8B is a cross section in the gate width direction showing the configuration of the semiconductor device according to the third exemplary embodiment of the present invention.

FIG. 8C is a cross section in the gate length direction showing the configuration of the semiconductor device according to the third exemplary embodiment of the present invention.

DESCRIPTION OF EMBODIMENTS

Hereinafter, exemplary embodiments of the present invention will be described with reference to the drawings.

First Exemplary Embodiment

Figure 1A:
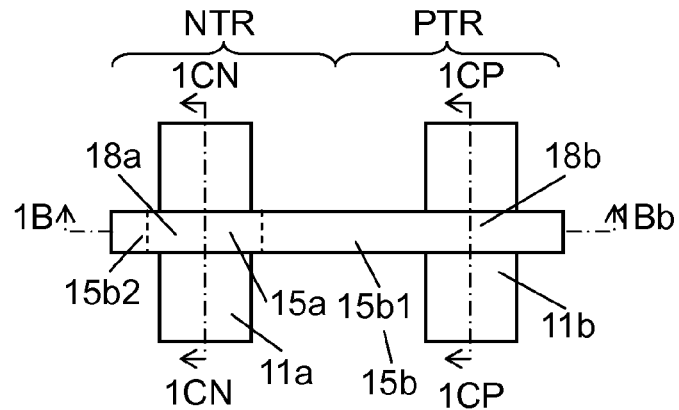
FIG. 1A is a plan view showing the configuration of a semiconductor device according to a first exemplary embodiment of the present invention.
Figure 1B:
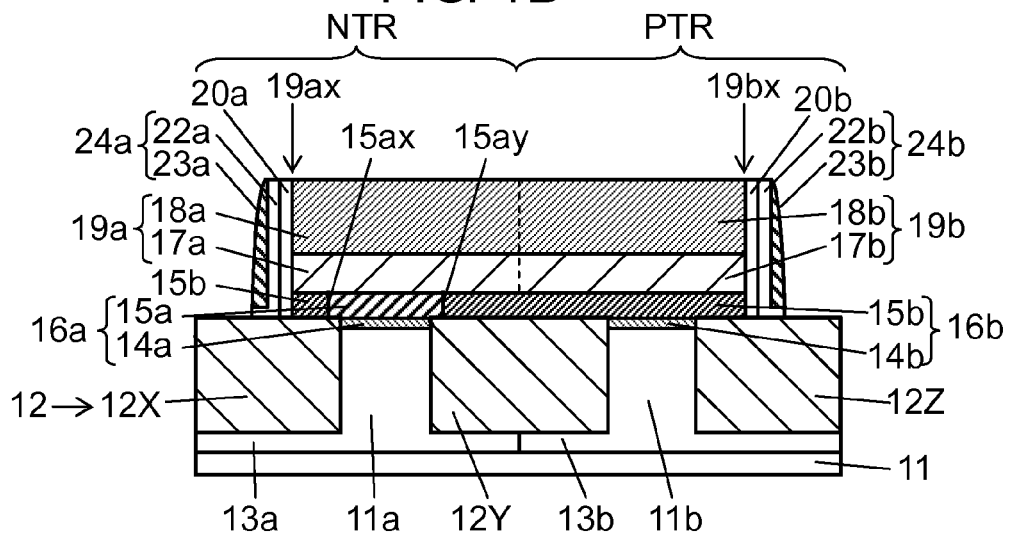
FIG. 1B is a cross section in the gate width direction showing the configuration of the semiconductor device according to the first exemplary embodiment of the present invention.
Figure 1C:
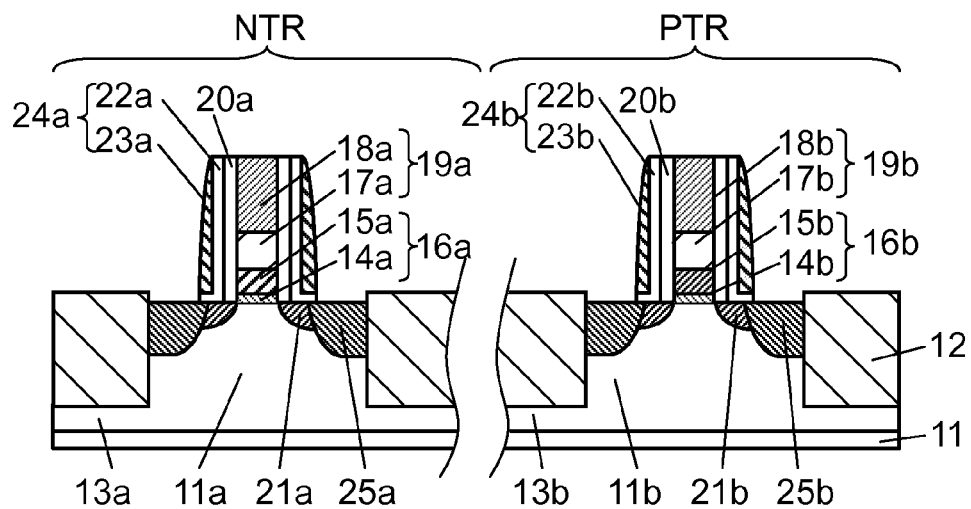
FIG. 1C is a cross section in the gate length direction showing the configuration of the semiconductor device according to the first exemplary embodiment of the present invention.

The configuration of a semiconductor device according to a first exemplary embodiment of the present invention will now be described with reference to FIGS. 1A to 1C. FIG. 1A is a plan view showing the configuration of the semiconductor device according to the exemplary embodiment. FIG. 1B is a cross section in the gate width direction showing the configuration of the semiconductor device according to the exemplary embodiment. FIG. 1C is a cross section in the gate length direction showing the configuration of the semiconductor device according to the exemplary embodiment. Specifically, FIG. 1B is a cross section taken along line 1B-1B shown in FIG. 1A. The left side (NTR) in FIG. 1C is a cross section taken along line 1CN-1CN shown in FIG. 1A. The right side (PTR) in FIG. 1C is a cross section taken along line 1CP-1CP shown in FIG. 1A. In FIG. 1A, only an active region, a high-dielectric-constant insulating film in a gate insulating film, and a silicon film in a gate electrode are illustrated and the other components are not shown.

As shown in FIGS. 1A to 1C, the semiconductor device according to the exemplary embodiment has an n-type MIS transistor and a p-type MIS transistor.

The n-type MIS transistor has p-type well region 13a formed in the n-type transistor region NTR in semiconductor substrate 11, and active region 11a surrounded by device isolation region 12 in semiconductor substrate 11 (p-type well region 13a). The n-type MIS transistor has gate insulating film 16a formed on active region 11a and device isolation region 12 and gate electrode 19a formed on gate insulating film 16a. The n-type MIS transistor has n-type extension regions 21a formed laterally below gate electrode 19a in active region 11a and offset spacer 20a formed on the side face of gate electrode 19a and whose sectional shape is an "I" shape. The n-type MIS transistor has sidewall 24a formed over the side face of gate electrode 19a via offset spacer 20a and n-type source drain regions 25a formed below the outer sides of sidewalls 24a in active region 11a.

The gate insulating film 16a has base film 14a formed on active region 11a and high-dielectric-constant insulating film 15a formed on base film 14a and device isolation region 12 and containing an n-type adjustment metal (for example, La). Gate electrode 19a has metal containing film 17a formed on gate insulating film 16a and silicon film 18a formed on metal containing film 17a. Sidewall 24a has inner sidewall 22a whose sectional shape is an L shape and outer sidewall 23a formed on inner sidewall 22a.

The p-type MIS transistor has n-type well region 13b formed in the p-type transistor region PTR in semiconductor substrate 11, and active region 11b surrounded by device isolation region 12 in semiconductor substrate 11 (n-type well region 13b). The p-type MIS transistor has gate insulating film 16b formed on active region 11b and device isolation region 12 and gate electrode 19b formed on gate insulating film 16b. P-type MIS transistor has p-type extension regions 21b formed laterally below gate electrode 19b in active region 11b and offset spacer 20b formed on side face of gate electrode 19b and whose sectional shape is an "I" shape. The p-type MIS transistor has sidewall 24b formed over the side face of gate electrode 19b via offset spacer 20b and p-type source drain regions 25b formed below the outer sides of sidewalls 24b in active region 11b.

The gate insulating film 16b has base film 14a formed on active region 11b and high-dielectric-constant insulating film 15b formed on base film 14b and device isolation region 12 and containing p-type adjustment metal (for example, Al). Gate electrode 19b has metal containing film 17b formed on gate insulating film 16b and silicon film 18b formed on metal containing film 17b. Sidewall 24b has inner sidewall 22b whose sectional shape is an L shape and outer sidewall 23b formed on inner sidewall 22b.

As shown in FIG. 1B, device isolation region 12 has first device isolation part 12X, second device isolation part 12Y, and third device isolation part 12Z.

In the specification, "second device isolation part 12Y" in device isolation region 12 refers to part positioned between active regions 11a and 11b. "First device isolation part 12X" in device isolation region 12 refers to part opposed to second device isolation part 12Y while sandwiching active region 11a. "Third device isolation part 12Z" in device isolation region 12 refers to a part opposed to second device isolation part 12Y while sandwiching active region 11b.

The n-type MIS transistor and the p-type MIS transistor construct a CMIS transistor having dual gate electrodes.

Active regions 11a and 11b are isolated from each other while sandwiching second device isolation part 12Y therebetween.

Gate electrodes 19a and 19b are connected to each other and integrally formed above second device isolation part 12Y. Specifically, metal containing films 17a and 17b are connected to each other and integrally formed above second device isolation part 12Y. Silicon films 18a and 18b are connected to each other and integrally formed above second device isolation part 12Y.

Offset spacers 20a and 20b are connected to each other and integrally formed above second device isolation part 12Y. Sidewalls 24a and 24b are connected to each other and integrally formed above second device isolation part 12Y.

In the exemplary embodiment, for easier understanding, in metal containing films 17a and 17b integrally formed, a part formed in the n-type transistor region NTR (that is, the left side from the center of second device isolation part 12Y) will be called metal containing film 17a. A part formed in the p-type transistor region PTR (that is, the right side from the center of second device isolation part 12Y) will be called metal containing film 17b. Metal containing films 17a and 17b are just discriminated from each other for easier understanding (refer to a dotted line shown in FIG. 1B) and a clear border does not exist between metal containing films 17a and 17b. Similarly, there is no clear border between silicon films 18a and 18b, between offset spacers 20a and 20b, and sidewalls 24a and 24b.

High-dielectric-constant insulating film 15a is formed on active region 11a (base film 14a) and first and second device isolation parts 12X and 12Y. High-dielectric-constant insulating film 15a has one end protruding on first device isolation part 12X and the other end protruding on second device isolation part 12Y. One side face 15ax in the gate width direction of high-dielectric-constant insulating film 15a is positioned on first device isolation part 12X. On the other hand, other side face 15ay in the gate width direction of high-dielectric-constant insulating film 15a is positioned on second device isolation part 12Y.

High-dielectric-constant insulating film 15b has first part 15b1 (refer to, particularly, FIG. 1A) formed on active region 11b (base film 14b) and second and third device isolation parts 12Y and 12Z. High-dielectric-constant insulating film 15b has second part 15b2 (refer to, particularly, FIG. 1A) formed between first device isolation part 12X and gate electrode 19a.

High-dielectric-constant insulating film 15a is sandwiched between first part 15b1 in high-dielectric-constant insulating film 15b and second part 15b2 in high-dielectric-constant insulating film 15b. First part 15b1 in high-dielectric-constant insulating film 15b is sandwiched between high-dielectric-constant insulating film 15a and offset spacer 20b. Second part 15b2 in high-dielectric-constant insulating film 15b is sandwiched between high-dielectric-constant insulating film 15a and offset spacer 20a.

First part 15b1 in high-dielectric-constant insulating film 15b is adjacent to the other end of high-dielectric-constant insulating film 15a on second device isolation part 12Y. Second part 15b2 in high-dielectric-constant insulating film 15b is adjacent to one end of high-dielectric-constant insulating film 15a on first device isolation part 12X. Other side face 15ay in the gate width direction of high-dielectric-constant insulating film 15a is in contact with first part 15b1 in high-dielectric-constant insulating film 15b. Side face 15ax in the gate width direction of high-dielectric-constant insulating film 15a is in contact with second part 15b2 in high-dielectric-constant insulating film 15b.

Gate electrode 19a has an end protruding on first device isolation part 12X. Gate electrode 19b has an end protruding on third device isolation part 12Z. Side face 19ax in the gate width direction of gate electrode 19a is positioned on first device isolation part 12X. Side face 19bx in the gate width direction of gate electrode 19b is positioned on third device isolation part 12Z.

Metal containing films 17a and 17b integrally formed are formed on the top face of high-dielectric-constant insulating film 15a and on the top face of high-dielectric-constant insulating film 15b. High-dielectric-constant insulating film 15b is formed between first part 15b1 and second part 15b2 so as to sandwich high-dielectric-constant insulating film 15a. One of the side faces in the gate width direction of metal containing films 17a and 17b integrally formed is in contact with offset spacer 20a. The other side face is in contact with offset spacer 20b.

Silicon films 18a and 18b integrally formed are formed on the top face of metal containing films 17a and 17b integrally formed.

The dual gate electrode has gate electrodes 19a and 19b integrally formed. Between one of both ends in the gate width direction of the dual gate electrode and first device isolation part 12X, second part 15b2 in high-dielectric-constant insulating film 15b is interposed. Between the other end and third device isolation part 12Z and between the p-n boundary in the dual gate electrode and second device isolation part 12Y, a part of first part 15b1 in high-dielectric-constant insulating film 15b is interposed. The "p-n boundary" in the dual gate electrode refers to a part formed on second device isolation part 12Y.

A protrusion amount of one end of high-dielectric-constant insulating film 15a on first device isolation part 12X (hereinbelow, called "the protrusion amount of one end of high-dielectric-constant insulating film 15a") is smaller than a protrusion amount of an end of gate electrode 19a protruding on first device isolation part 12X (hereinbelow, called "the protrusion amount of one end of gate electrode 19a")

In the specification, "the protrusion amount of one end of high-dielectric-constant insulating film 15a" denotes a distance from one end in the gate width direction of active region 11a to one side face 15ax in the gate width direction of high-dielectric-constant insulating film 15a. "The protrusion amount of one end of gate electrode 19a" denotes a distance from one end in the gate width direction of active region 11a to side face 19ax in the gate width direction of gate electrode 19a. The "one end" in the gate width direction of active region 11a is an end adjacent to first device isolation part 12X.

The protrusion amount of one end of high-dielectric-constant insulating film 15a and the protrusion amount of the other end of high-dielectric-constant insulating film 15a protruding on second device isolation part 12Y (hereinbelow, called "the protrusion amount of the other end of high-dielectric-constant insulating film 15a") are, for example, the same (or "about the same").

In the specification, "the protrusion amount of the other end of high-dielectric-constant insulating film 15a" denotes a distance from the other end in the gate width direction of active region 11a to other side face 15ay in the gate width direction of high-dielectric-constant insulating film 15a. The "other end" in the gate width direction of active region 11a is an end adjacent to second device isolation part 12Y.

Each of the protrusion amount of the one end of high-dielectric-constant insulating film 15a and the protrusion amount of the other end of high-dielectric-constant insulating film 15a is, for example, in a range between 10 nm and 50 nm. The protrusion amount of the end of gate electrode 19a is, for example, in a range between 60 nm and 150 nm.

The distance from the other end in the gate width direction of active region 11a to other side face 15ay in the gate width direction of high-dielectric-constant insulating film 15a (in other words, the protrusion amount of the other end of high-dielectric-constant insulating film 15a) is shorter than the distance from the other end in the gate width direction of active region 11b to other side face 15ay in the gate width direction of high-dielectric-constant insulating film 15a. In other words, the protrusion amount of the other end in high-dielectric-constant insulating film 15a is smaller than the distance from the other end in the gate width direction of active region 11a to the center of second device isolation part 12Y.

In the specification, the "other end" in the gate width direction of active region 11b is an end adjacent to second device isolation part 12Y.

The protrusion amount of the end of metal containing film 17a on first device isolation part 12X and the protrusion amount of the end of silicon film 18a on first device isolation part 12X are, for example, the same (or "about the same"). The protrusion amount of the end of metal containing film 17b on third device isolation part 12Z and that of the end of silicon film 18b on third device isolation part 12Z are, for example, the same (or "about the same").

In the semiconductor device according to the exemplary embodiment, without depending on the protrusion amount of the end of gate electrode 19a, the protrusion amount of the one end of high-dielectric-constant insulating film 15a can be made smaller than that of the end of gate electrode 19a. Further, the protrusion amount of the other end in high-dielectric-constant insulating film 15a does not depend on the distance from the other end in the gate width direction of active region 11a to the center of second device isolation part 12Y. Consequently, the protrusion amount of the other end of high-dielectric-constant insulating film 15a can be made smaller than the distance from the other end in the gate width direction of active region 11a to the center of second device isolation part 12Y.

Figure 10A:
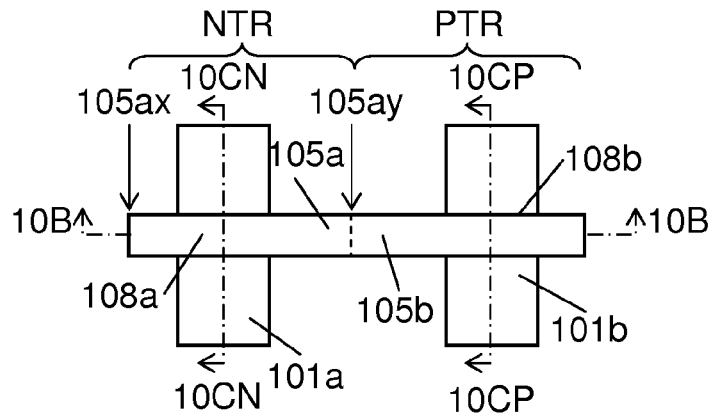
FIG. 10A is a plan view showing the configuration of a conventional semiconductor device.
Figure 10B:
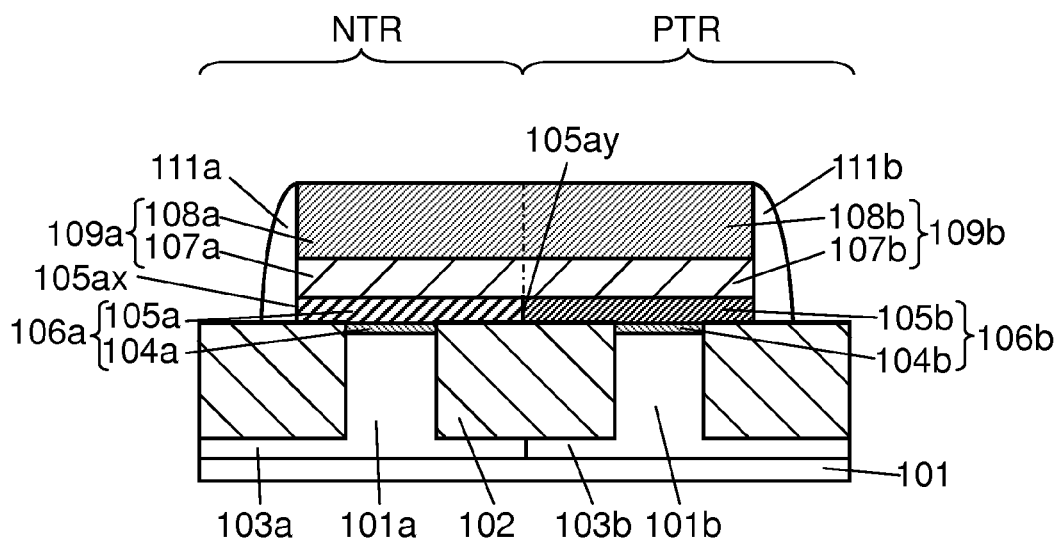
FIG. 10B is a cross section in the gate width direction showing the configuration of the conventional semiconductor device.
Figure 10C:
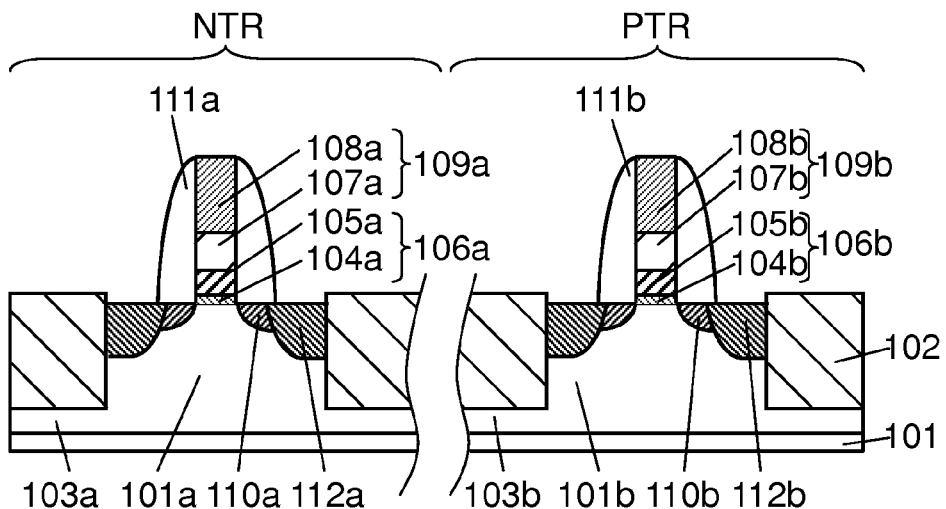
FIG. 10C is a cross section in the gate length direction showing the configuration of the conventional semiconductor device.

In such a manner, the protrusion amount of high-dielectric-constant insulating film 15a on device isolation region 12 can be reduced. Consequently, as compared with the conventional n-type MIS transistor as shown in FIGS. 10A to 10C, the contact area in which the high-dielectric-constant insulating film 15a is in contact with device isolation region 12 can be made smaller. Accordingly, the oxygen diffusion amount of oxygen contained in device isolation region 12 which is diffused into high-dielectric-constant insulating film 15a can be reduced. Therefore, even if the gate width is reduced as the size of the semiconductor device is becoming smaller, the threshold voltage of the n-type MIS transistor can be prevented from being increased.

In the case of the exemplary embodiment, as compared with the conventional p-type MIS transistor as shown in FIGS. 10A to 10C, the contact area in which high-dielectric-constant insulating film 15b is in contact with device isolation region 12 is larger. However, as described above, in the case of the p-type MIS transistor, as compared with the n-type MIS transistor, the diffusion amount of oxygen diffused into the high-dielectric-constant insulating film is smaller. As a result, the threshold voltage of the p-type MIS transistor is only slightly increased.

Hereinafter, a method of manufacturing the semiconductor device according to the first exemplary embodiment of the present invention will be described with reference to FIGS. 2A to 2C, FIGS. 3A to 3C, and FIGS. 4A to 4C. FIGS. 2A to 3C are cross sections in the gate width direction showing the method of manufacturing the semiconductor device according to the exemplary embodiment in process order. FIGS. 4A to 4C are cross sections in the gate length direction showing the method of manufacturing the semiconductor device according to the exemplary embodiment in process order. The processes shown in FIGS. 3A to 3C correspond to those shown in FIGS. 4A to 4C, respectively.

Figure 2A:
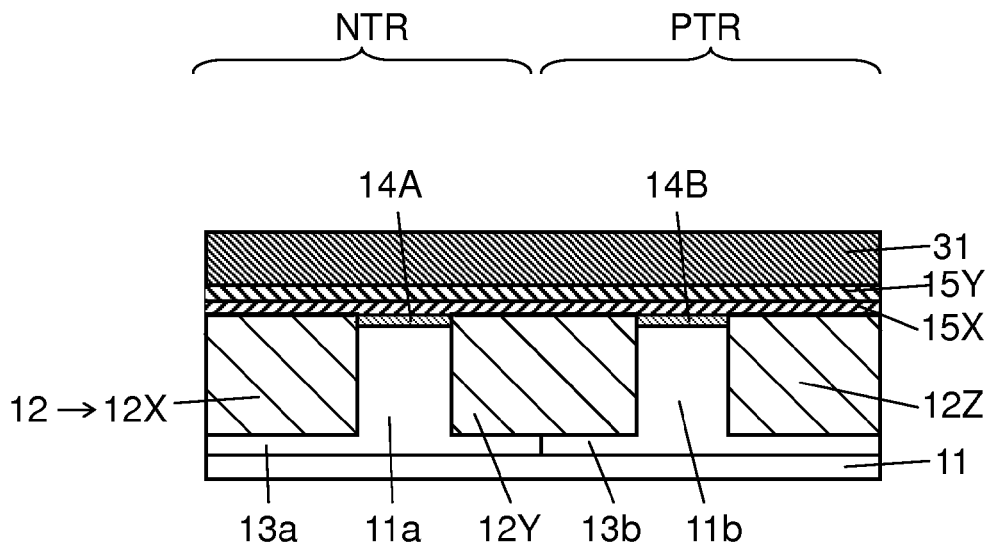
FIG. 2A is a cross section in the gate width direction showing a method of manufacturing the semiconductor device according to the first exemplary embodiment of the present invention in process order.

First, as shown in FIG. 2A, for example, on semiconductor substrate 11 made of silicon, device isolation region 12 made of, for example, silicon oxide ($SiO_2$) is formed. By the operation, active region 11a surrounded by device isolation region 12 is formed in the n-type transistor region NTR in semiconductor substrate 11. Simultaneously, active region 11b surrounded by device isolation region 12 is formed in the p-type transistor region PTR in semiconductor substrate 11. In the cross section in the gate width direction, by active regions 11a and 11b, device isolation region 12 can be divided to first, second, and third device isolation parts 12X, 12Y, and 12Z. After that, p-type well region 13a is formed in the n-type transistor region NTR in semiconductor substrate 11. On the other hand, n-type well region 13b is formed in the p-type transistor region PTR in semiconductor substrate 11.

Next, the surface of semiconductor substrate 11 is thermally oxidized. By the operation, base film 14A made of silicon oxide is formed on active region 11a. Simultaneously, base film 14B made of silicon oxide is formed on active region 11b. After that, on the entire face of semiconductor substrate 11, high-dielectric-constant insulating film 15X, p-type metal film 15Y for adjustment containing a p-type metal for adjustment, and protection film 31 are sequentially formed. The thickness of each of base films 14A and 14B is, for example, about 0.8 nm to 1.2 nm. The thickness of high-dielectric-constant insulating film 15X is, for example, about 1 nm to 2 nm. The thickness of p-type metal film 15Y for adjustment is, for example, about 0.8 nm to 1.5 nm. The thickness of protection film 31 is, for example, about 5 nm to 20 nm. High-dielectric-constant insulating film 15X is an insulating film made of, for example, hafnium oxide (HfSiO, HfSiON, HfO, HfON, HfZrO, HfZrON, or the like). P-type metal film 15Y for adjustment is an aluminum oxide film ($Al_2O_3$ film) containing a p-type metal for adjustment such as Al. Protection film 31 is made of, for example, titanium nitride (TiN).

Figure 2B:
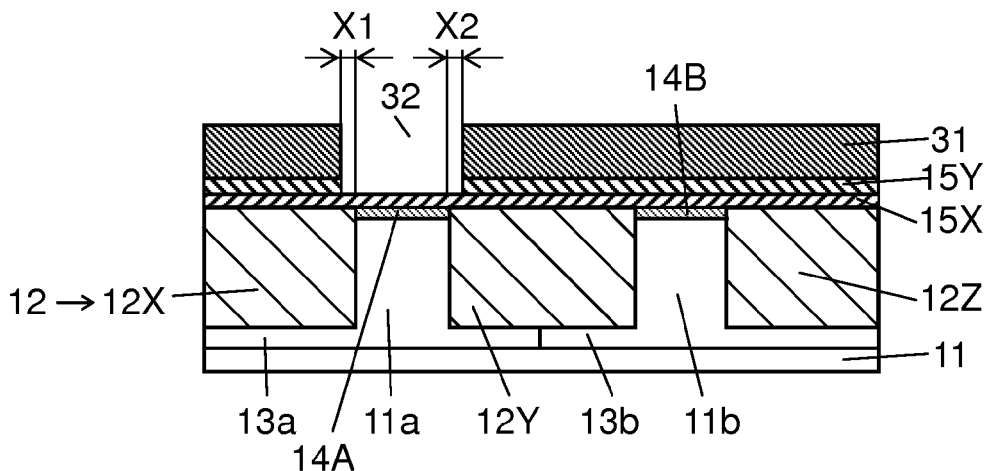
FIG. 2B is a cross section in the gate width direction showing the method of manufacturing the semiconductor device according to the first exemplary embodiment of the present invention in process order.

Next, as shown in FIG. 2B, by photolithography and etching, a part of protection film 31 and p-type metal film 15Y for adjustment formed above active region 11a is removed. Therefore, opening 32 is formed to expose high-dielectric-constant insulating film 15X as the bottom face. The opening width in the gate width direction of opening 32 is larger than the width in the gate width direction of the surface of active region 11a. Each of distances X1 and X2 is, for example, in a range between 10 nm and 50 nm.

Figure 2C:
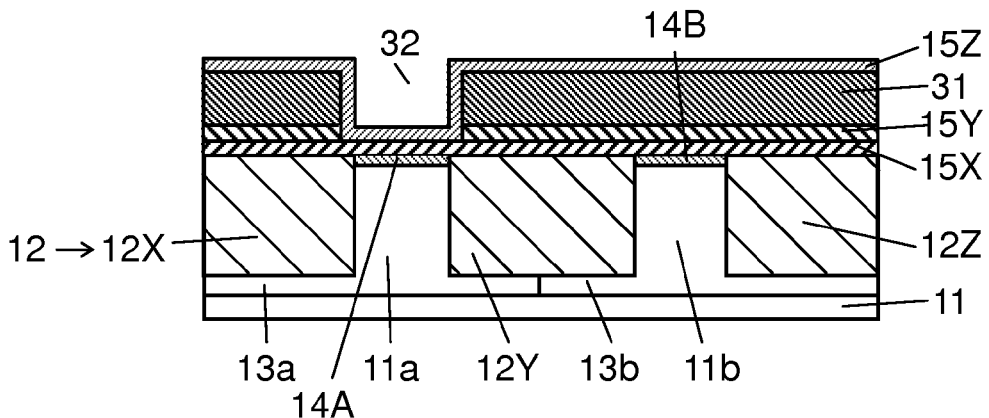
FIG. 2C is a cross section in the gate width direction showing the method of manufacturing the semiconductor device according to the first exemplary embodiment of the present invention in process order.

Next, as shown in FIG. 2C, on the entire face of semiconductor substrate 11, n-type metal film 15Z for adjustment containing n-type metal for adjustment is formed. By the operation, n-type metal film 15Z for adjustment is formed on the part in the bottom face, in which high-dielectric-constant insulating film 15X is exposed from opening 32. The thickness of n-type metal film 15Z for adjustment is, for example, about 1.5 nm to 2.5 nm. N-type metal film 15Z for adjustment is a lanthanum oxide film (LaO film) containing an n-type metal for adjustment such as La.

Figure 3A:
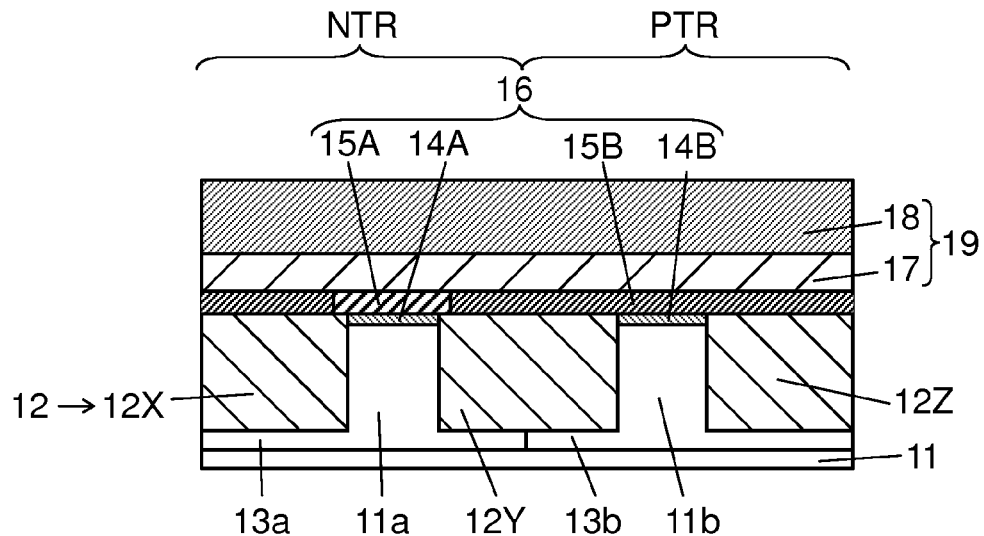
FIG. 3A is a cross section in the gate width direction showing the method of manufacturing the semiconductor device according to the first exemplary embodiment of the present invention in process order.
Figure 3B:
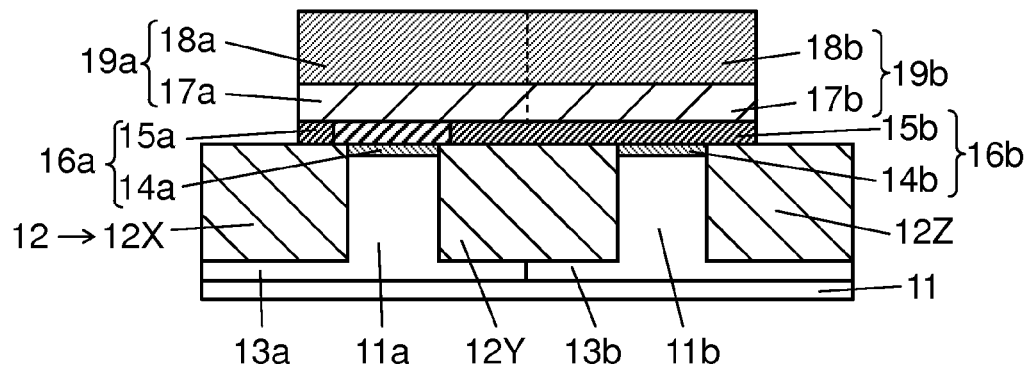
FIG. 3B is a cross section in the gate width direction showing the method of manufacturing the semiconductor device according to the first exemplary embodiment of the present invention in process order.
Figure 4A:
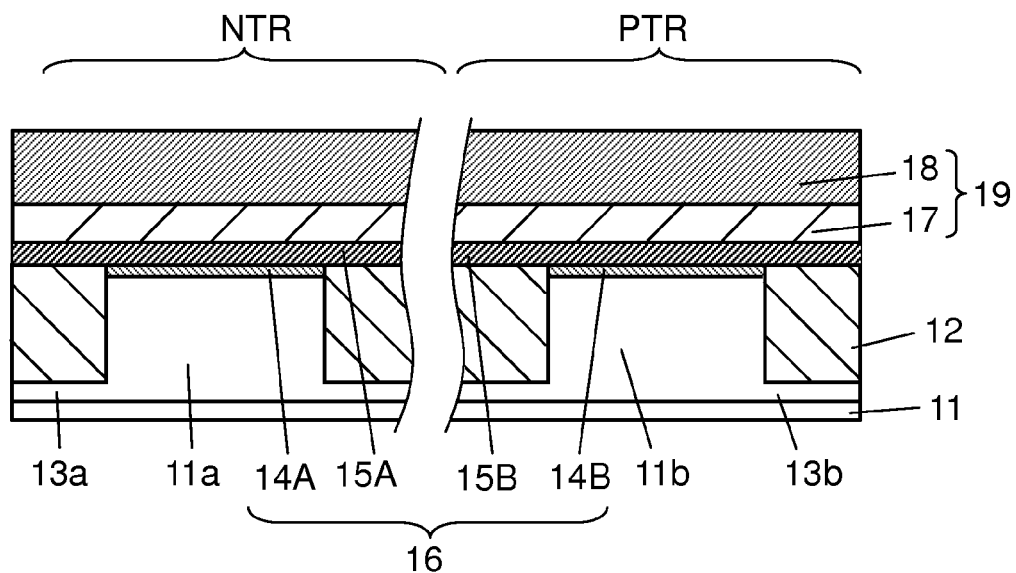
FIG. 4A is a cross section in the gate length direction showing the method of manufacturing the semiconductor device according to the first exemplary embodiment of the present invention in process order.
Figure 4B:
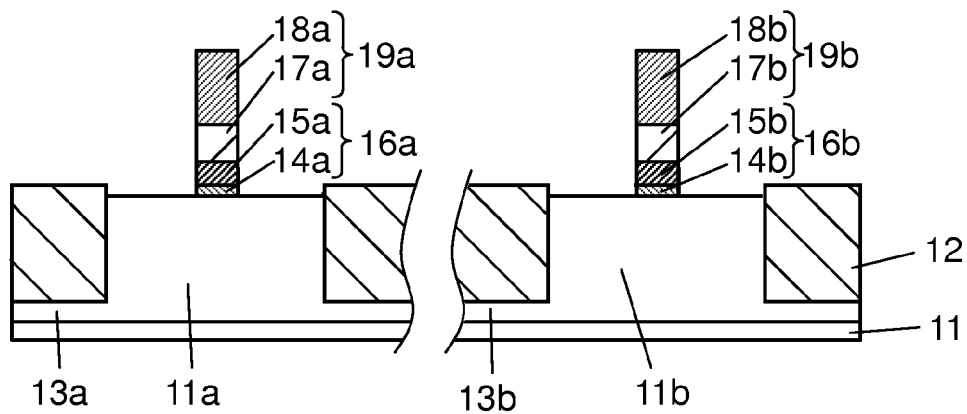
FIG. 4B is a cross section in the gate length direction showing the method of manufacturing the semiconductor device according to the first exemplary embodiment of the present invention in process order.
Figure 4C:
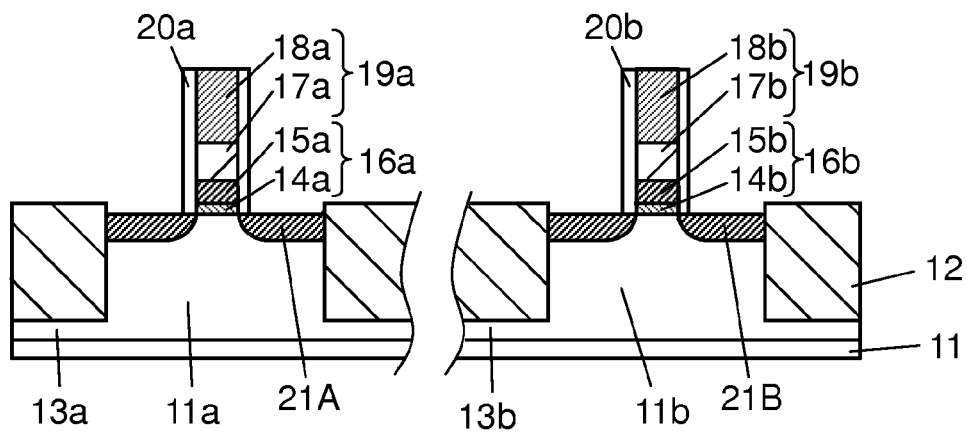
FIG. 4C is a cross section in the gate length direction showing the method of manufacturing the semiconductor device according to the first exemplary embodiment of the present invention in process order.

Subsequently, as shown in FIGS. 3A and 4A, heat treatment of, for example, about 700° C. is performed on semiconductor substrate 11. By the heat treatment, the n-type metal for adjustment (for example, La) in n-type metal film 15Z for adjustment is diffused into high-dielectric-constant insulating film 15X to form high-dielectric-constant insulating film 15A containing the n-type metal for adjustment. Simultaneously, the p-type metal for adjustment (for example, Al) in p-type metal film 15Y for adjustment is diffused into high-dielectric-constant insulating film 15X to form high-dielectric-constant insulating film 15B containing the p-type metal for adjustment. At this time, by protection film 31, the n-type metal for adjustment (such as La) in n-type metal film 15Z for adjustment can be prevented from being diffused into the part formed below protection film 31 in high-dielectric-constant insulating film 15X. The width in the gate width direction of high-dielectric-constant insulating film 15A is substantially the same as that in the gate width direction of the high-dielectric-constant insulating film (see 15a in FIG. 3B) to be formed later. After that, remaining n-type metal film 15Z for adjustment, remaining p-type metal film 15Y for adjustment, and protection film 31 are removed.

In such a manner, film 16 for the gate insulating film having base films 14A and 14B and high-dielectric-constant insulating films 15A and 15B is formed. The width in the gate width direction of high-dielectric-constant insulating film 15A is set to be substantially the same as that in the gate width direction of the high-dielectric insulating film (see 15a in FIG. 3B).

Next, as shown in FIGS. 3A and 4A, for example, by the CVD (Chemical Vapor Deposition) method, metal containing film 17 made of, for example titanium nitride or tantalum nitride (TaN) is formed on film 16 for the gate insulating film. After that, for example, by the CVD method, on metal containing film 17, for example, silicon film 18 made of polysilicon is formed. The thickness of metal containing film 17 is, for example, about 5 nm to 20 nm. The thickness of silicon film 18 is, for example, about 40 nm to 80 nm. In such a manner, gate electrode film 19 having metal containing film 17 and silicon film 18 is formed on film 16 for the gate insulating film.

As shown in FIGS. 3B and 4B, by photolithography, a resist pattern (not shown) having a gate electrode pattern shape is formed on gate electrode film 19. After that, using the resist pattern as a mask, for example, by dry etching, gate electrode film 19 and film 16 for the gate insulating film are sequentially patterned. Gate electrode film 19 has metal containing film 17 and silicon film 18, and film 16 for the gate insulating film has base films 14A and 14B and high-dielectric-constant insulating films 15A and 15B. After that, the resist pattern is removed. By the operation, gate electrode 19a having metal containing film 17a and silicon film 18a is formed over active region 11a via gate insulating film 16a having base film 14a and high-dielectric-constant insulating film 15a containing the n-type metal for adjustment. Simultaneously, gate electrode 19b having metal containing film 17b and silicon film 18b is formed over active region 11b via gate insulating film 16b having base film 14b and high-dielectric-constant insulating film 15b containing the p-type metal for adjustment.

Figure 3C:
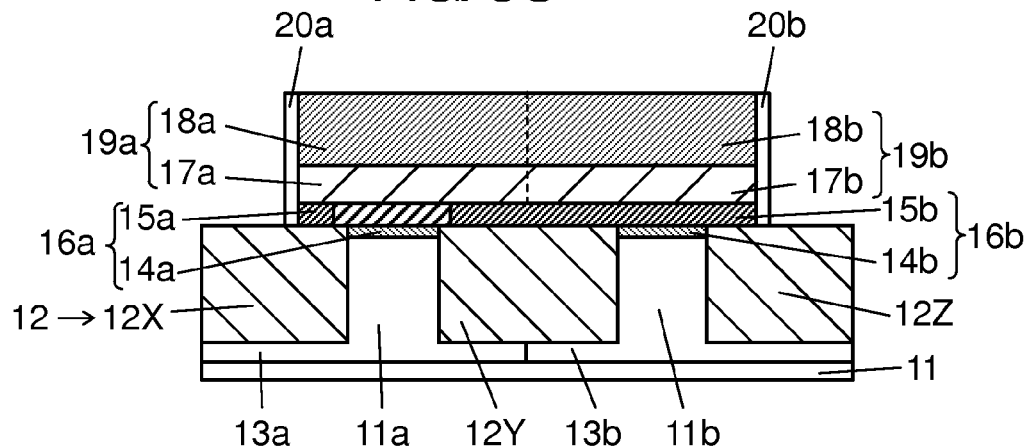
FIG. 3C is a cross section in the gate width direction showing the method of manufacturing the semiconductor device according to the first exemplary embodiment of the present invention in process order.

As shown in FIGS. 3C and 4C, on the entire face of semiconductor substrate 11, a film for the offset spacer made of silicon nitride (SiN) is formed. After that, for example, anisotropic dry etching is performed on the film for the offset spacer. By the operation, offset spacer 20a whose sectional shape is an "I" shape is formed on the side face of gate electrode 19a. At the same time, offset spacer 20b whose sectional shape is an "I" shape is formed on the side face of gate electrode 19b.

After that, using gate electrode 19a and offset spacer 20a as a mask, ions of n-type impurity such as arsenic (As) are implanted. By the operation, n-type extension implantation region 21A (particularly, refer to FIG. 4C) laterally below gate electrode 19a in active region 11a. On the other hand, using gate electrode 19b and offset spacer 20b as a mask, ions of p-type impurity such as boron fluoride (BF2) are implanted. By the operation, p-type extension implantation region 21B (particularly, refer to FIG. 4C) laterally below gate electrode 19b in active region 11b.

Next, for example, by the CVD method, on the entire face of semiconductor substrate 11, a film for an inner sidewall made of, for example, silicon oxide and a film for an outer sidewall made of, for example, silicon nitride are sequentially formed. After that, for example, anisotropic dry etching is performed sequentially on the film for the outer sidewall and the film for the inner sidewall. By the operation, as shown in FIGS. 1B and 1C, sidewall 24a having inner sidewall 22a whose sectional shape is an L shape and outer sidewall 23a is formed over the side face of gate electrode 19a via offset spacer 20a. Simultaneously, sidewall 24b having inner sidewall 22b whose sectional shape is an L shape and outer sidewall 23b is formed over the side face of gate electrode 19b via offset spacer 20b.

After that, using gate electrode 19a and sidewall 24a as a mask, ions of n-type impurity such as arsenic are implanted. By the operation, an n-type source-drain implantation region is formed below the outside of sidewall 24a in active region 11a. On the other hand, using gate electrode 19b and sidewall 24b as a mask, ions of p-type impurity such as boron (B) are implanted. By the operation, a p-type source-drain implantation region is formed below the outside of sidewall 24b in active region 11b.

After that, heat treatment of, for example, about 1000° C. is performed on semiconductor substrate 11. By the treatment, as shown in FIG. 1C, the n-type impurity contained in n-type extension implantation region 21A is activated to form n-type extension region 21a. Simultaneously, the n-type impurity contained in the n-type source-drain implantation region is activated to form n-type source-drain region 25a. At the same time, the p-type impurity contained in p-type extension implantation region 21B is activated to form p-type extension region 21b. Simultaneously, the p-type impurity contained in the p-type source-drain implantation region is activated to form p-type source-drain region 25b.

In such a manner, the semiconductor device according to the exemplary embodiment can be manufactured.

According to the method of manufacturing the semiconductor device of the exemplary embodiment, as shown in FIG. 3A, high-dielectric-constant insulating film 15A whose width in the gate width direction is set to be substantially the same as that in the gate width direction of high-dielectric-constant insulating film 15a to be formed later is formed. After that, gate electrode 19a is formed as shown in FIG. 3B. In other words, after the width in the gate width direction of high-dielectric-constant insulating film 15a is determined, the width in the gate width direction of gate electrode 19a is determined.

Consequently, the protrusion amount of one end of high-dielectric-constant insulating film 15a can be determined independently from the protrusion amount of the end of gate electrode 19a. As a result, the protrusion amount of one end of high-dielectric-constant insulating film 15a can be made smaller than that of the end of gate electrode 19a. Further, the protrusion amount of the other end of high-dielectric-constant insulating film 15a can be determined independently from the distance from the other end in the gate width direction of active region 11a to the center of second device isolation part 12Y. As a result, the protrusion amount of the other end of high-dielectric-constant insulating film 15a can be made smaller than the distance from the other end in the gate width direction of active region 11a to the center of second device isolation part 12Y.

Therefore, the protrusion amount of high-dielectric-constant insulating film 15a on device isolation region 12 can be decreased. Consequently, the contact area in which high-dielectric-constant insulating film 15a is in contact with device isolation region 12 can be made smaller than that in the conventional n-type MIS transistor as shown in FIGS. 10A to 10C. Accordingly, at the time of the heat treatment performed after formation of high-dielectric-constant insulating film 15A (for example, a heat treatment for activating the impurity contained in the source-drain implantation region), the oxygen diffusion amount of diffusing oxygen included in device isolation region 12 into high-dielectric-constant insulating film 15a can be reduced. Therefore, as the size of the semiconductor device is decreased, even if the gate width is narrowed, the threshold voltage of the n-type MIS transistor can be prevented from becoming higher.

In the exemplary embodiment, a silicide layer may be formed on each of silicon film 18a in gate electrode 19a, n-type source-drain region 25a, silicon film 18b in gate electrode 19b, and p-type source-drain region 25b.

Second Exemplary Embodiment

Figure 5A:
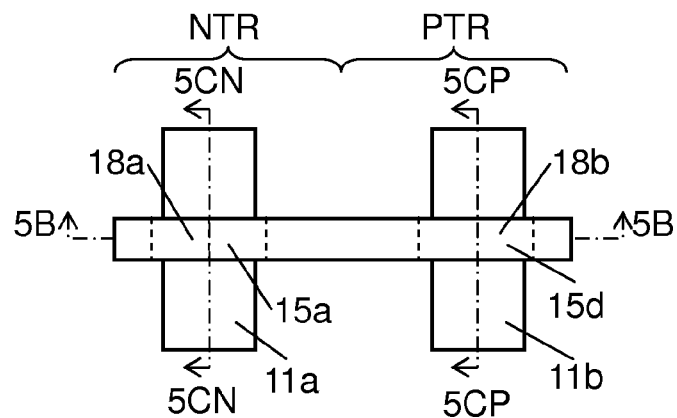
FIG. 5A is a plan view showing the configuration of a semiconductor device according to a second exemplary embodiment of the present invention.
Figure 5B:
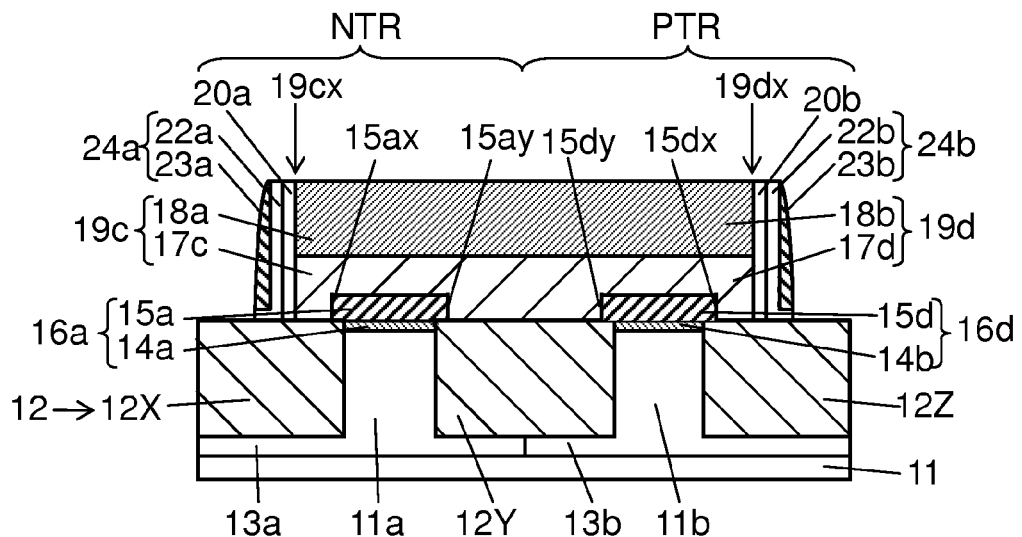
FIG. 5B is a cross section in the gate width direction showing the configuration of the semiconductor device according to the second exemplary embodiment of the present invention.
Figure 5C:
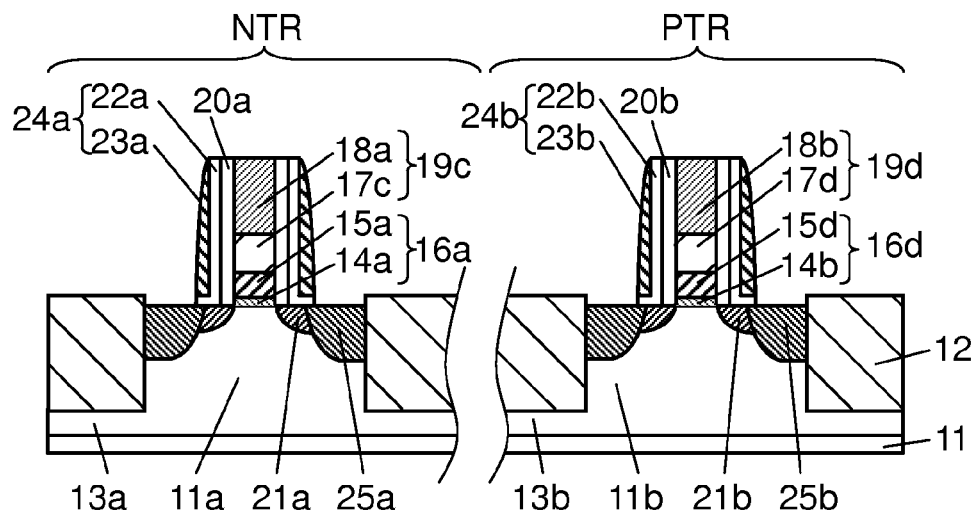
FIG. 5C is a cross section in the gate length direction showing the configuration of the semiconductor device according to the second exemplary embodiment of the present invention.

Hereinafter, the configuration of a semiconductor device according to a second exemplary embodiment of the present invention will be described with reference to FIGS. 5A to 5C. FIG. 5A is a plan view showing the configuration of the semiconductor device according to the exemplary embodiment. FIG. 5B is a cross section in the gate width direction showing the configuration of the semiconductor device according to the exemplary embodiment. FIG. 5C is a cross section in the gate length direction showing the configuration of the semiconductor device according to the exemplary embodiment. Specifically, FIG. 5B is a cross section taken along line 5B-5B shown in FIG. 5A. The left side (NTR) in FIG. 5C is a cross section taken along line 5CN-5CN shown in FIG. 5A. The right side (PTR) in FIG. 5C is a cross section taken along line 5CP-5CP shown in FIG. 5A. In FIG. 5A, only an active region, a high-dielectric-constant insulating film in a gate insulating film, and a silicon film in a gate electrode are illustrated and the other components are not shown. In FIGS. 5A to 5C, the same reference numerals as those shown in FIGS. 1A to 1C are designated to components similar to those in the first exemplary embodiment. In the second exemplary embodiment, description similar to that in the first exemplary embodiment will not be repeated.

The first and second exemplary embodiments are different with respect to the following points. First, the shape of high-dielectric-constant insulating film 15b and that of high-dielectric-constant insulating film 15d are different from each other. Second, as the shape of high-dielectric-constant insulating film 15b and that of high-dielectric-constant insulating film 15d are different from each other, the shape of metal containing films 17a and 17b integrally formed and that of metal containing films 17c and 17d integrally formed are different from each other.

As shown in FIG. 5B, high-dielectric-constant insulating film 15d is formed on active region 11b (base film 14b) and second and third device isolation parts 12Y and 12Z. High-dielectric-constant insulating film 15d has one end protruding on third device isolation part 12Z and the other end protruding on second device isolation part 12Y. One side face 15dx in the gate width direction of high-dielectric-constant insulating film 15d is positioned on third device isolation part 12Z. On the other hand, other side face 15dy in the gate width direction of high-dielectric-constant insulating film 15d is positioned on second device isolation part 12Y.

The other end of high-dielectric-constant insulating film 15a and that of high-dielectric-constant insulating film 15d are apart from each other on second device isolation part 12Y. One end of high-dielectric-constant insulating film 15a is apart from offset spacer 20a on first device isolation part 12X. One end of high-dielectric-constant insulating film 15d is apart from offset spacer 20b on third device isolation part 12Z.

Gate electrode 19c has an end protruding on first device isolation part 12X. Gate electrode 19d has an end protruding on third device isolation part 12Z. Side face 19cx in the gate width direction of gate electrode 19c is positioned on first device isolation part 12X. Side face 19dx in the gate width direction of gate electrode 19d is positioned on third device isolation part 12Z.

Metal containing films 17c and 17d are connected to each other and integrally formed on second isolation part 12Y. One of both side faces in the gate width direction of metal containing films 17c and 17d integrally formed is in contact with offset spacer 20a. The other side face is in contact with offset spacer 20b.

Metal containing film 17c is formed so as to cover the top face of high-dielectric-constant insulating film 15a and one side face 15ax and other side face 15ay in the gate width direction of high-dielectric-constant insulating film 15a. Metal containing film 17d is formed so as to cover the top face of high-dielectric-constant insulating film 15d and one side face 15dx and other side face 15dy in the gate width direction of high-dielectric-constant insulating film 15d.

One side face 15ax and other side face 15ay in the gate width direction of high-dielectric-constant insulating film 15a are in contact with metal containing film 17c in gate electrode 19c. One side face 15dx and other side face 15dy in the gate width direction of high-dielectric-constant insulating film 15d are in contact with metal containing film 17d in gate electrode 19d.

Silicon films 18a and 18b integrally formed are formed on the top face of metal containing films 17c and 17d integrally formed.

No high-dielectric-constant insulating film is interposed between one of both ends in the gate width direction of the dual gate electrode having gate electrodes 19c and 19d integrally formed and first device isolation part 12X. The under face of the one end is in contact with first device isolation part 12X. No high-dielectric-constant insulating film is interposed between the other end and third device isolation part 12Z, and the under face of the other end is in contact with third device isolation part 12Z. No high-dielectric-constant insulating film is interposed between the p-n boundary part in the dual gate electrode and second device isolation part 12Y, and the under face of the p-n boundary part is in contact with second device isolation part 12Y.

A protrusion amount of one end of high-dielectric-constant insulating film 15a is smaller than that of an end of gate electrode 19c. The protrusion amount of one end of high-dielectric-constant insulating film 15a and that of the other end of high-dielectric-constant insulating film 15a are, for example, the same (or "about the same"). Each of the protrusion amount of the one end of high-dielectric-constant insulating film 15a and the protrusion amount of the other end of high-dielectric-constant insulating film 15a is, for example, in a range between 10 nm and 50 nm. The protrusion amount of the end of gate electrode 19c is, for example, in a range between 60 nm and 150 nm.

The protrusion amount of the one end of high-dielectric-constant insulating film 15d on third device isolation part 12Z (hereinbelow, called "the protrusion amount of the one end of high-dielectric-constant insulating film 15d") is smaller than the protrusion amount of the end of gate electrode 19d protruding on third device isolation part 12Z (hereinbelow, called "the protrusion amount of the end of gate electrode 19d").

The protrusion amount of the end of high-dielectric-constant insulating film 15d and the protrusion amount of the other end of high-dielectric-constant insulating film 15d protruding on second device isolation part 12Y (hereinbelow, called "the protrusion amount of the other end of high-dielectric-constant insulating film 15d") are, for example, the same (or "about the same").

Each of the protrusion amount of the one end of high-dielectric-constant insulating film 15d and that of the other end of high-dielectric-constant insulating film 15d is, for example, in a range between 10 nm and 50 nm. The protrusion amount of the end of gate electrode 19d is, for example, in a range between 60 nm and 150 nm.

The distance from the other end in the gate width direction of active region 11b to other side face 15dy in the gate width direction of high-dielectric-constant insulating film 15d (in other words, the protrusion amount of the other end of high-dielectric-constant insulating film 15d) is shorter than the distance from the other end in the gate width direction of active region 11a to other side face 15dy in the gate width direction of high-dielectric-constant insulating film 15d. In other words, the protrusion amount of the other end in high-dielectric-constant insulating film 15d is smaller than the distance from the other end in the gate width direction of active region 11b to the center of second device isolation part 12Y.

The protrusion amount of the end of metal containing film 17c on first device isolation part 12X and the protrusion amount of the end of silicon film 18a on first device isolation part 12X are, for example, the same (or "about the same"). The protrusion amount of the end of metal containing film 17d on third device isolation part 12Z and that of the end of silicon film 18b on third device isolation part 12Z are, for example, the same (or "about the same").

In the specification, "the protrusion amount of one end of high-dielectric-constant insulating film 15d" denotes a distance from one end in the gate width direction of active region 11b to one side face 15dx in the gate width direction of high-dielectric-constant insulating film 15d. "The protrusion amount of the other end of high-dielectric-constant insulating film 15d" denotes a distance from the other end in the gate width direction of active region 11b to other side face 15dy in the gate width direction of high-dielectric-constant insulating film 15d. "The protrusion amount of the end of gate electrode 19d" denotes a distance from one end in the gate width direction of active region 11b to side face 19dx in the gate width direction of gate electrode 19d. The "one end" in the gate width direction of active region 11b is an end adjacent to third device isolation part 12Z. The "other end" in the gate width direction of active region 11b is an end adjacent to second device isolation part 12Y.

Hereinafter, a method of manufacturing the semiconductor device according to the second exemplary embodiment of the present invention will be described with reference to FIGS. 6A to 6C and FIGS. 7A to 7C. FIGS. 6A to 7C are cross sections in the gate width direction showing the method of manufacturing the semiconductor device according to the exemplary embodiment in process order. In FIGS. 6A to 7C, the same reference numerals as those shown in FIGS. 2A to 4C are designated to components similar to those of the first exemplary embodiment. In the exemplary embodiment, therefore, description similar to that of the first exemplary embodiment will not be repeated.

First, processes similar to those shown in FIG. 2A in the first exemplary embodiment are performed. As a result, a configuration similar to that shown in FIG. 2A is obtained.

Figure 6A:
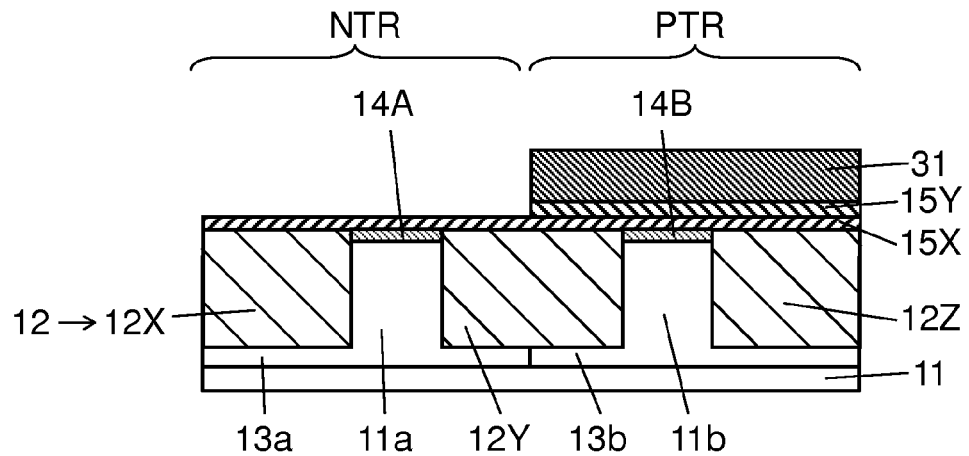
FIG. 6A is a cross section in the gate width direction showing a method of manufacturing the semiconductor device according to the second exemplary embodiment of the present invention in process order.

Next, as shown in FIG. 6A, by photolithography and etching, a part of protection film 31 and p-type metal film 15Y for adjustment formed on the n-type transistor region NTR is sequentially removed. By the operation, p-type metal film 15Y for adjustment and protection film 31 are left on the part of high-dielectric-constant insulating film 15X formed in the p-type transistor region PTR.

Figure 6B:
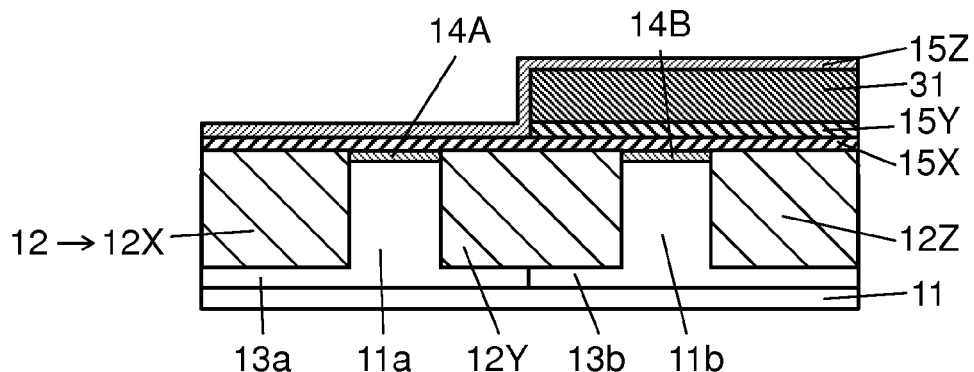
FIG. 6B is a cross section in the gate width direction showing the method of manufacturing the semiconductor device according to the second exemplary embodiment of the present invention in process order.

Next, as shown in FIG. 6B, on the entire face of semiconductor substrate 11, n-type metal film 15Z for adjustment is formed. By the operation, n-type metal film 15Z for adjustment is formed on the part of high-dielectric-constant insulating film 15X formed in the n-type transistor region NTR. The thickness of n-type metal film 15Z for adjustment is, for example, about 1.5 nm to 2.5 nm. N-type metal film 15Z for adjustment is an n-type metal for adjustment such as a lanthanum oxide film (LaO film) containing La.

Figure 6C:
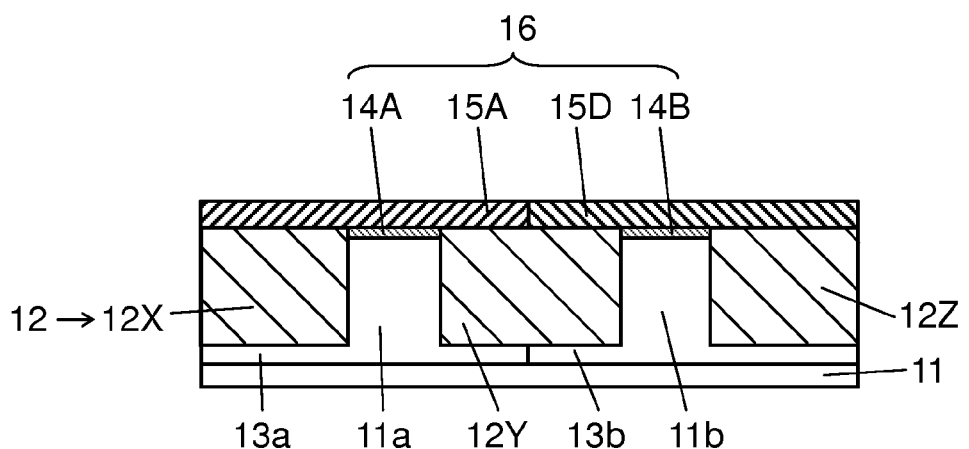
FIG. 6C is a cross section in the gate width direction showing the method of manufacturing the semiconductor device according to the second exemplary embodiment of the present invention in process order.

Subsequently, as shown in FIG. 6C, heat treatment of, for example, about 700° C. is performed on semiconductor substrate 11. By the heat treatment, the n-type metal for adjustment (for example, La) in n-type metal film 15Z for adjustment is diffused into high-dielectric-constant insulating film 15X to form high-dielectric-constant insulating film 15A containing the n-type metal for adjustment. Simultaneously, the p-type metal for adjustment (for example, Al) in p-type metal film 15Y for adjustment is diffused into high-dielectric-constant insulating film 15X to form high-dielectric-constant insulating film 15D containing the p-type metal for adjustment. At this time, by protection film 31, the n-type metal for adjustment (such as La) in n-type metal film 15Z for adjustment can be prevented from being diffused into the part of high-dielectric-constant insulating film 15X formed below protection film 31. After that, remaining n-type metal film 15Z for adjustment, remaining p-type metal film 15Y for adjustment, and protection film 31 are removed. In such a manner, film 16 for the gate insulating film having base films 14A and 14B and high-dielectric-constant insulating films 15A and 15D is formed.

Figure 7A:
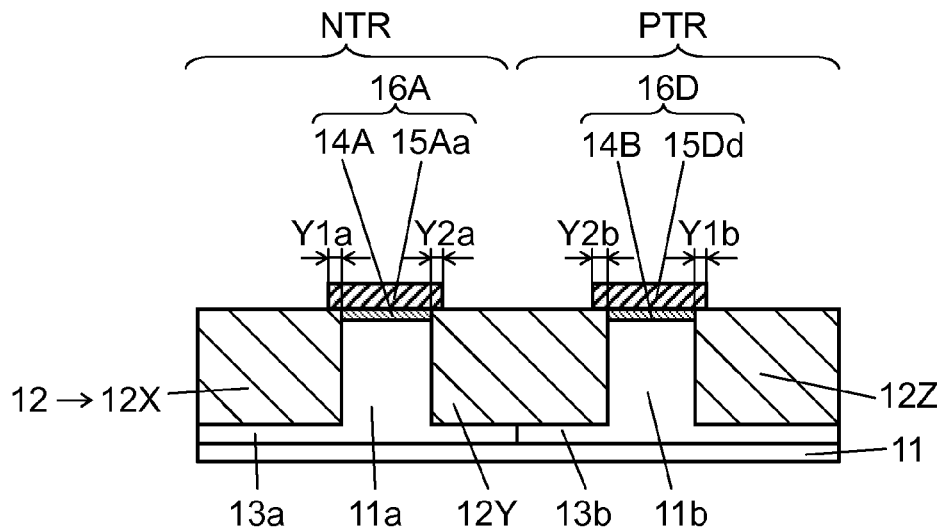
FIG. 7A is a cross section in the gate width direction showing the method of manufacturing the semiconductor device according to the second exemplary embodiment of the present invention in process order.

Next, as shown in FIG. 7A, by photolithography and etching, high-dielectric-constant insulating films 15A and 15D are patterned. As a result, high-dielectric-constant insulating films 15Aa and 15Dd are formed.

The width in the gate width direction of high-dielectric-constant insulating film 15Aa is substantially the same as that in the gate width direction of the high-dielectric-constant insulating film (see 15a in FIG. 7C) to be formed later. In other words, protrusion amount Y1a and protrusion amount Y2a are substantially the same as a protrusion amount of one end of high-dielectric-constant insulating film 15a and a protrusion amount of the other end of high-dielectric-constant insulating film 15a, respectively. The width in the gate width direction of high-dielectric-constant insulating film 15Dd is substantially the same as that in the gate width direction of the high-dielectric-constant insulating film (see 15d in FIG. 7C) to be formed later. In other words, protrusion amount Y1b and protrusion amount Y2b are substantially the same as the protrusion amount of one end of high-dielectric-constant insulating film 15d and the protrusion amount of the other end of high-dielectric-constant insulating film 15d, respectively. Protrusion amounts Y1a, Y2a, Y1b, and Y2b are, for example, the same (or "about the same") and each of which is, for example, in a range between 10 nm and 50 nm.

It is sufficient that the width in the gate length direction of high-dielectric-constant insulating film 15Aa is at least larger than the gate length of the gate electrode (see 19c in FIG. 7C) to be formed later. For example, the high-dielectric-constant insulating film 15Aa is, desirably, formed so as to completely cover the surface of active region 11a. Similarly, it is sufficient that the width in the gate length direction of high-dielectric-constant insulating film 15Dd is at least larger than the gate length of the gate electrode (see 19d in FIG. 7C) to be formed later and, desirably, high-dielectric-constant insulating film 15Dd is formed so as to completely cover the surface of active region 11b.

In such a manner, film 16A for the gate insulating film having base film 14A and high-dielectric-constant insulating film 15Aa is formed. The high-dielectric-constant insulating film 15Aa is set so that the width in the gate width direction becomes substantially the same as that in the gate width direction of the high-dielectric-constant insulating film (see 15a in FIG. 7C). Film 16D for the gate insulating film having base film 14B and high-dielectric-constant insulating film 15Dd is formed. High-dielectric-constant insulating film 15Dd is set so that its width in the gate width direction becomes substantially the same as that in the gate width direction of the high-dielectric-constant insulating film (see 15d in FIG. 7C).

Figure 7B:
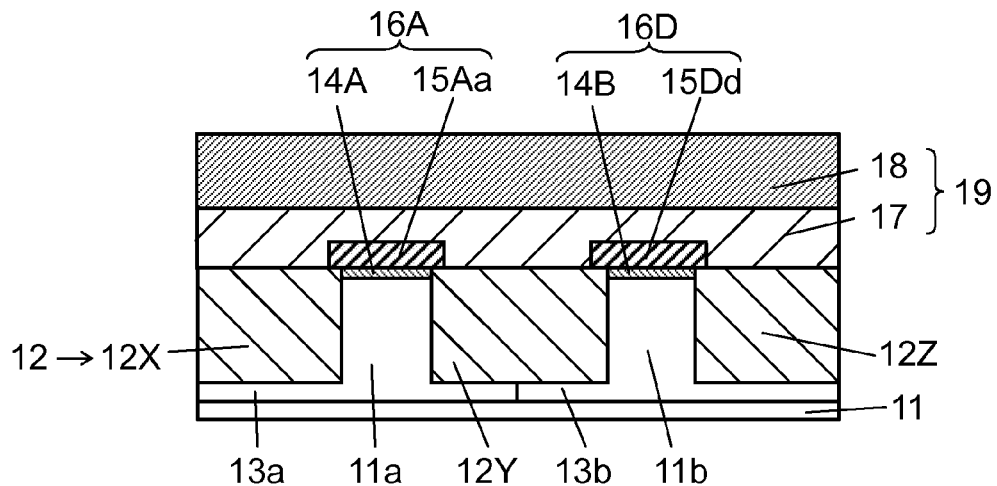
FIG. 7B is a cross section in the gate width direction showing the method of manufacturing the semiconductor device according to the second exemplary embodiment of the present invention in process order.

Next, as shown in FIG. 7B, for example, by the CVD method, on the entire face of semiconductor substrate 11, metal containing film 17 made of, for example, titanium nitride or tantalum nitride is formed so as to cover high-dielectric-constant insulating films 15Aa and 15Dd. After that, for example, by the CVD method, silicon film 18 made of polysilicon is formed on metal containing film 17. The thickness of metal containing film 17 is, for example, about 5 nm to 20 nm. The thickness of silicon film 18 is, for example, about 40 nm to 80 nm. In such a manner, gate electrode film 19 having metal containing film 17 and silicon film 18 is formed.

Figure 7C:
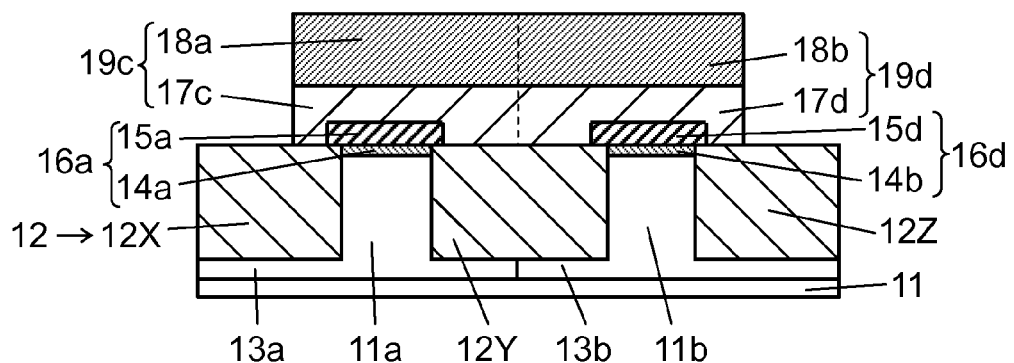
FIG. 7C is a cross section in the gate width direction showing the method of manufacturing the semiconductor device according to the second exemplary embodiment of the present invention in process order.

Next, as shown in FIG. 7C, by photolithography, a resist pattern (not shown) having a gate electrode pattern shape is formed on gate electrode film 19. After that, using the resist pattern as a mask, for example, by dry etching, gate electrode film 19, film 16A for the gate insulating film, and film 16D for a gate insulating film are sequentially patterned. Gate electrode film 19 has metal containing film 17 and silicon film 18. Film 16A for the gate insulating film has base film 14A and high-dielectric-constant insulating film 15Aa. Film 16D for the gate insulating film has base film 14B and high-dielectric-constant insulating film 15Dd. After that, the resist pattern is removed. By the operation, gate electrode 19c having metal containing film 17c and silicon film 18a is formed over active region 11a via gate insulating film 16a having base film 14a and high-dielectric-constant insulating film 15a containing the n-type metal for adjustment. Simultaneously, gate electrode 19d having metal containing film 17d and silicon film 18b is formed over active region 11b via gate insulating film 16d having base film 14b and high-dielectric-constant insulating film 15d containing the p-type metal for adjustment.

FIG. 7C is the cross section in the gate width direction, so FIG. 7C does not show the following things. But FIG. 4B, in the first exemplary embodiment, is the cross section in the gate length direction, so FIG. 4B shows the following things. Both ends in the gate length direction of base film 14A and high-dielectric-constant insulating film 15Aa are removed, and base film 14a and high-dielectric-constant insulating film 15a whose width in the gate length direction is smaller than the width in the gate length direction of base film 14A and high-dielectric-constant insulating film 15Aa are formed. Similarly, both ends in the gate length direction of base film 14B and high-dielectric-constant insulating film 15Dd are removed, and base film 14b and high-dielectric-constant insulating film 15d whose width in the gate length direction is smaller than the width in the gate length direction of base film 14B and high-dielectric-constant insulating film 15Dd are formed.

Next, processes similar to the processes after the processes shown in FIGS. 3C and 4C in the first exemplary embodiment are performed. As a result, offset spacers 20a and 20b, n-type extension region 21a, p-type extension region 21b, sidewalls 24a and 24b, n-type source drain region 25a, and p-type source drain region 25b are formed.

In such a manner, the semiconductor device according to the exemplary embodiment can be manufactured.

By the semiconductor device according to the exemplary embodiment and the method of manufacturing the same, effects similar to those of the first exemplary embodiment can be obtained.

Further, the following effects can be obtained.

As shown in FIG. 7A, high-dielectric-constant insulating film 15Dd whose width in the gate width direction is set so as to be substantially the same as that in the gate width direction of high-dielectric-constant insulating film 15d to be formed later is formed. After that, gate electrode 19d is formed as shown in FIG. 7C. In other words, after determining the width in the gate width direction of high-dielectric-constant insulating film 15d, the width in the gate width direction of gate electrode 19d is determined.

Consequently, without depending on the protrusion amount of the end in gate electrode 19d, the projection amount of one end of high-dielectric-constant insulating film 15d can be determined independently. As a result, the protrusion amount of one end of high-dielectric-constant insulating film 15d can be made smaller than that of the end of gate electrode 19d. Further, without depending on the distance from the other end in the gate width direction of active region 11b to the center of second device isolation part 12Y, the protrusion amount of the other end of high-dielectric-constant insulating film 15d can be determined independently. Consequently, the protrusion amount of the other end of high-dielectric-constant insulating film 15d can be made smaller than the distance from the other end in the gate width direction of active region 11b to the center of second device isolation part 12Y.

Since the protrusion amount of high-dielectric-constant insulating film 15d on device isolation region 12 can be decreased as described above, the contact area in which high-dielectric-constant insulating film 15d is in contact with device isolation region 12 can be made smaller than that in the conventional p-type MIS transistor as shown in FIGS. 10A to 10C. Accordingly, at the time of the heat treatment performed after formation of high-dielectric-constant insulating film 15D, the oxygen diffusion amount of diffusing oxygen included in device isolation region 12 into high-dielectric-constant insulating film 15d can be reduced. Therefore, the threshold voltage of the p-type MIS transistor can be prevented from becoming slightly higher.

Further, the following effects can be obtained.

In the exemplary embodiment, as shown in FIG. 6B, the heat treatment is performed in a state where the n-p contact face in which n-type metal film 15Z for adjustment and p-type metal film 15Y for adjustment are in contact with each other is positioned just above the center of second device isolation part 12Y and not above active regions 11a and 11b.

For example, it is assumed that, at the time of heat treatment, due to the difference between diffusion speed of La and diffusion speed of Al, the p-type metal for adjustment (for example, Al) contained in p-type metal film 15Y for adjustment is diffused laterally below p-type metal film 15Y for adjustment in high-dielectric-constant insulating film 15X. However, since the heat treatment is performed in a state where the n-p contact face is not just above active region 11a, the p-type metal for adjustment (for example, Al) can be prevented from being diffused into a part formed just above active region 11a in high-dielectric-constant insulating film 15X. Therefore, the threshold voltage of the n-type MIS transistor can be stabilized. Similarly, since the heat treatment is performed in a state where the n-p contact face is not just above active region 11b, the n-type metal for adjustment (for example, La) contained in n-type metal film 15Z for adjustment can be prevented from being diffused into a part formed just above active region 11b in high-dielectric-constant insulating film 15X. Therefore, the threshold voltage of the p-type MIS transistor can be stabilized.

Further, the following effects can be obtained.

In the exemplary embodiment, as shown in FIG. 6C, high-dielectric-constant insulating film 15A is formed by heat treatment. After that, as shown in FIG. 7A, high-dielectric-constant insulating film 15A is patterned to form high-dielectric-constant insulating film 15Aa. High-dielectric-constant insulating film 15Aa is set so that protrusion amount Y1a and protrusion amount Y2a are substantially the same as the protrusion amount of one end of high-dielectric-constant insulating film 15a and the protrusion amount of the other end of high-dielectric-constant insulating film 15a, respectively. In such a manner, after the heat treatment, the protrusion amount of one end of high-dielectric-constant insulating film 15a and the protrusion amount of the other end of high-dielectric-constant insulating film 15a are determined.

For example, it is assumed that, due to the difference between diffusion speed of La and diffusion speed of Al, the boundary face between high-dielectric-constant insulating films 15A and 15D is not positioned just below of n-p contact face (in other words, just above the center of second device isolation part 12Y) but is positioned on the left side (or the right side) of the center of second device isolation part 12Y. However, since the protrusion amount of the other end in high-dielectric-constant insulating film 15a is determined after the heat treatment, the protrusion amount of the other end of high-dielectric-constant insulating film 15a can be prevented from becoming shorter (or longer) than a design amount. Therefore, it can be prevented that the protrusion amount of the other end of high-dielectric-constant insulating film 15a becomes shorter (or longer) than a design amount so that the threshold voltage of the n-type MIS transistor becomes lower (or higher) than design voltage. Thus, the threshold voltage of the n-type MIS transistor can be further stabilized.

Third Exemplary Embodiment

Hereinafter, the configuration of a semiconductor device according to a third exemplary embodiment of the present invention will be described with reference to FIGS. 8A to 8C. FIG. 8A is a plan view showing the configuration of the semiconductor device according to the exemplary embodiment. FIG. 8B is a cross section in the gate width direction showing the configuration of the semiconductor device according to the exemplary embodiment. FIG. 8C is a cross section in the gate length direction showing the configuration of the semiconductor device according to the exemplary embodiment. Specifically, FIG. 8B is a cross section taken along line 8B-8B shown in FIG. 8A. The left side (NTR) in FIG. 8C is a cross section taken along line 8CN-8CN shown in FIG. 8A. The right side (PTR) in FIG. 8C is a cross section taken along line 8CP-8CP shown in FIG. 8A. In FIG. 8A, only an active region and a metal containing film and a silicon film in a gate electrode are illustrated and the other components are not shown. In FIGS. 8A to 8C, the same reference numerals as those shown in FIGS. 5A to 5C are designated to components similar to those in the second exemplary embodiment. Therefore, in the third exemplary embodiment, description similar to that in the second exemplary embodiment will not be repeated.

The second and third exemplary embodiments are different with respect to the following points. First, although metal containing films 17c and 17d are integrally formed in the second exemplary embodiment, in the third exemplary embodiment, metal containing films 17e and 17f are apart from each other. Second, accompanying the fact that metal containing films 17e and 17f are apart from each other, the shape of silicon films 18a and 18b integrally formed and that of silicon films 18e and 18f integrally formed are different from each other.

As shown in FIG. 8B, metal containing film 17e is formed on the top face of high-dielectric-constant insulating film 15a. Metal containing film 17f is formed on the top face of high-dielectric-constant insulating film 15d. Metal containing films 17e and 17f are not connected to each other but are apart from each other on second device isolation part 12Y. Metal containing film 17e is apart from offset spacer 20a on first device isolation part 12X. Metal containing film 17f is apart from offset spacer 20b on third device isolation part 12Z.

Silicon films 18e and 18f are connected to each other and integrally formed on second device isolation part 12Y. The side face in the gate width direction of silicon film 18e (refer to side face 19ex in the gate width direction of gate electrode 19e) is in contact with offset spacer 20a. The side face in the gate width direction of silicon film 18f (refer to side face 19fx in the gate width direction of gate electrode 19f) is in contact with offset spacer 20b.

Silicon film 18e is formed so as to cover the top face of metal containing film 17e, one side face 17ex and other side face 17ey in the gate width direction of metal containing film 17e, and one side face and the other side face in the gate width direction of high-dielectric-constant insulating film 15a. Silicon film 18f is formed so as to cover the top face of metal containing film 17f, one side face 17fx and other side face 17fy in the gate width direction of metal containing film 17f, and one side face and the other side face in the gate width direction of high-dielectric-constant insulating film 15d.

One side face and the other side face in the gate width direction of high-dielectric-constant insulating film 15a are in contact with silicon film 18e in gate electrode 19e. One side face and the other side face in the gate width direction of high-dielectric-constant insulating film 15d are in contact with silicon film 18f in gate electrode 19f.

One side face 17ex and other side face 17ey in the gate width direction of metal containing film 17e are in contact with silicon film 18e in gate electrode 19e. One side face 17fx and other side face 17fy in the gate width direction of metal containing film 17f are in contact with silicon film 18f in gate electrode 19f.

Both ends in the gate width direction of silicon films 18e and 18f integrally formed are as follows. Specifically, between one of the ends and first device isolation part 12X, no metal containing film and no high-dielectric-constant insulating film are interposed. The under face of the one of the ends is in contact with first device isolation part 12X. Between the other end and third device isolation part 12Z, no metal containing film and no high-dielectric-constant insulating film are interposed, and the under face of the other end is in contact with third device isolation part 12Z. Between the p-n boundary part in silicon films 18e and 18f integrally formed and second device isolation part 12Y, no metal containing film and no high-dielectric-constant insulating film are interposed, and the under face of the p-n boundary part is in contact with second device isolation part 12Y. The "p-n boundary part" in silicon films 18e and 18f integrally formed refers to a part formed on second device isolation part 12Y.

The planar shape of metal containing film 17e and that of high-dielectric-constant insulating film 15a are substantially the same. In other words, the width in the gate width direction and the width in the gate length direction of metal containing film 17e are substantially same as the width in the gate width direction and the width in the gate length direction, respectively, of high-dielectric-constant insulating film 15a. The planar shape of metal containing film 17f and that of high-dielectric-constant insulating film 15d are substantially the same. In other words, the width in the gate width direction and the width in the gate length direction of metal containing film 17f are substantially same as the width in the gate width direction and the width in the gate length direction, respectively, of high-dielectric-constant insulating film 15d.

A protrusion amount of one end of metal containing film 17e on first device isolation part 12X (hereinbelow, called "protrusion amount of one end of metal containing film 17e") is the same (or "almost the same") as that of one end of high-dielectric-constant insulating film 15a and is, for example, in a range between 10 nm and 50 nm. On the other hand, a protrusion amount of the other end of metal containing film 17e on second device isolation part 12Y (hereinbelow, called "protrusion amount of the other end of metal containing film 17e") is the same (or "almost the same") as that of the other end of high-dielectric-constant insulating film 15a and is, for example, in a range between 10 nm and 50 nm. The protrusion amount of one end of metal containing film 17e and that of the other end of metal containing film 17e are, for example, the same (or "almost the same").

A protrusion amount of one end of metal containing film 17f on third device isolation part 12Z (hereinbelow, called "protrusion amount of one end of metal containing film 17f") is the same (or "almost the same") as that of one end of high-dielectric-constant insulating film 15d and is, for example, in a range between 10 nm and 50 nm. On the other hand, a protrusion amount of the other end of metal containing film 17f on second device isolation part 12Y (hereinbelow, called "protrusion amount of the other end of metal containing film 17f") is the same (or "almost the same") as that of the other end of high-dielectric-constant insulating film 15d and is, for example, in a range between 10 nm and 50 nm. The protrusion amount of one end of metal containing film 17f and that of the other end of metal containing film 17f are, for example, the same (or "almost the same").

The protrusion amount of one end of metal containing film 17e is smaller than a protrusion amount of an end of silicon film 18e on first device isolation part 12X (hereinbelow, called "protrusion amount of an end of silicon film 18e"). The protrusion amount of an end of silicon film 18e is, for example, in a range between 60 nm and 150 nm.

The protrusion amount of one end of metal containing film 17f is smaller than a protrusion amount of an end of silicon film 18f on third device isolation part 12Z (hereinbelow, called "protrusion amount of an end of silicon film 18f"). The protrusion amount of an end of silicon film 18f is, for example, in a range between 60 nm and 150 nm.

Figure 9A:
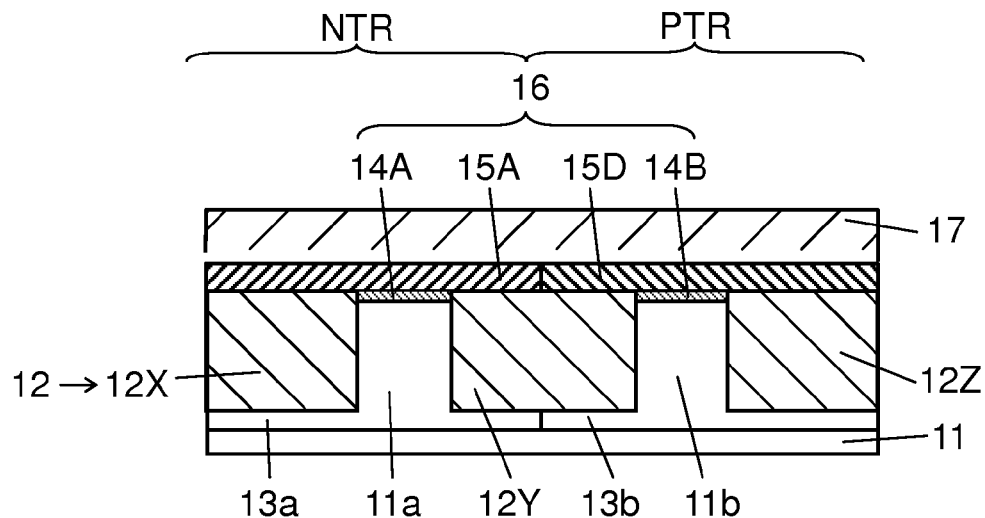
FIG. 9A is a cross section in the gate width direction showing a method of manufacturing the semiconductor device according to the third exemplary embodiment of the present invention in process order.
Figure 9B:
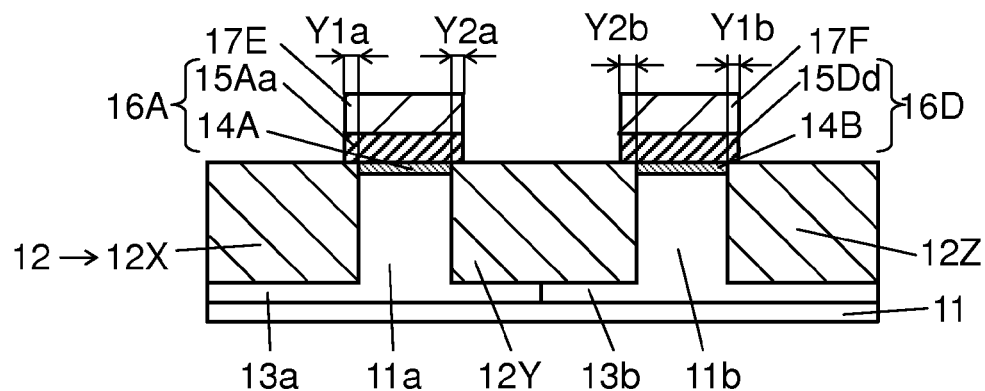
FIG. 9B is a cross section in the gate width direction showing the method of manufacturing the semiconductor device according to the third exemplary embodiment of the present invention in process order.
Figure 9C:
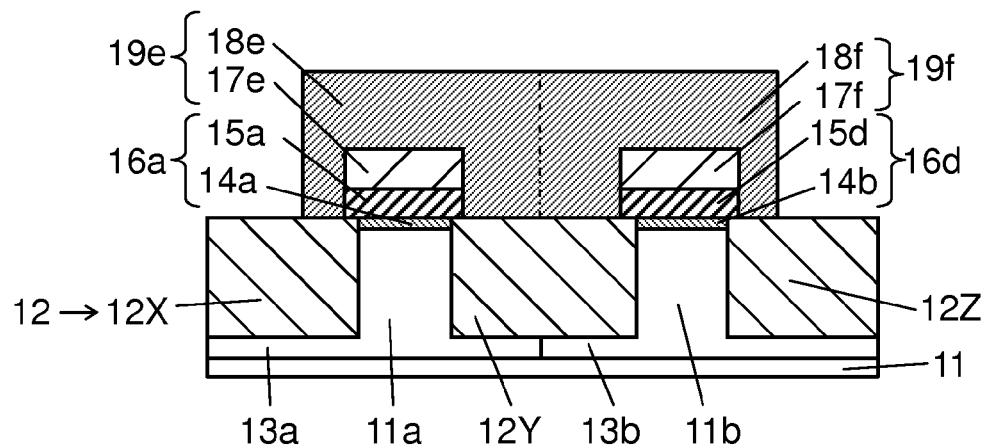
FIG. 9C is a cross section in the gate width direction showing the method of manufacturing the semiconductor device according to the third exemplary embodiment of the present invention in process order.

Hereinafter, a method of manufacturing the semiconductor device according to the third exemplary embodiment of the present invention will be described with reference to FIGS. 9A to 9C. FIGS. 9A to 9C are cross sections in the gate width direction showing the method of manufacturing the semiconductor device according to the exemplary embodiment in process order. In FIGS. 9A to 9C, the same reference numerals as those shown in FIGS. 6A to 7C are designated to components similar to those of the second exemplary embodiment. In the exemplary embodiment, therefore, description similar to that of the second exemplary embodiment will not be repeated.

First, processes similar to those shown in FIGS. 6A to 6C in the second exemplary embodiment are performed. As a result, a configuration similar to that shown in FIG. 6C is obtained.

Next, as shown in FIG. 9A, for example, by the CVD method, metal containing film 17 made of, for example, titanium nitride or tantalum nitride is formed on film 16 for the gate insulating film. The thickness of metal containing film 17 is, for example, about 5 nm to 20 nm.

Subsequently, as shown in FIG. 9B, by photolithography and etching, metal containing film 17 and high-dielectric-constant insulating films 15A and 15D are sequentially patterned. By the operation, high-dielectric-constant insulating films 15Aa and 15Dd and metal containing films 17E and 17F are formed.

The width in the gate width direction of high-dielectric-constant insulating film 15Aa and that of metal containing film 17E are substantially the same as that in the gate width direction of the high-dielectric-constant insulating film (see 15a in FIG. 9C) to be formed later and that of the metal containing film (see 17e in FIG. 9C), respectively. The width in the gate width direction of high-dielectric-constant insulating film 15Dd and that of metal containing film 17F are substantially the same as that in the gate width direction of the high-dielectric-constant insulating film (see 15d in FIG. 9C) to be formed later and that of the metal containing film (see 17f in FIG. 9C), respectively. The planar shape of high-dielectric-constant insulating film 15Aa and that of metal containing film 17E are substantially the same. The planar shape of high-dielectric-constant insulating film 15Dd and that of metal containing film 17F are substantially the same. Protrusion amounts Y1a, Y2a, Y1b, and Y2b are, for example, the same (or "about the same") and each of which is, for example, in a range between 10 nm and 50 nm.

It is sufficient that the width in the gate length direction of high-dielectric-constant insulating film 15Aa and metal containing film 17E is at least larger than the gate length of the gate electrode (see 19e in FIG. 9C) to be formed later. For example, high-dielectric-constant insulating film 15Aa and metal containing film 17E are, desirably, formed so as to completely cover the surface of active region 11a. Similarly, it is sufficient that the width in the gate length direction of high-dielectric-constant insulating film 15Dd and metal containing film 17F is at least larger than the gate length of the gate electrode (see 19f in FIG. 9C) to be formed later. For example, desirably, high-dielectric-constant insulating film 15Dd and metal containing film 17F are formed so as to completely cover the surface of active region 11b.

In such a manner, film 16A for the gate insulating film and film 16D for the gate insulating film are formed. Film 16A for the gate insulating film has base film 14A and high-dielectric-constant insulating film 15Aa whose width in the gate width direction is set so as to be substantially the same as that in the gate width direction of the high-dielectric-constant insulating film (see 15a in FIG. 9C). Film 16D for the gate insulating film has base film 14B and high-dielectric-constant insulating film 15Dd whose width in the gate width direction is set so as to be substantially the same as that in the gate width direction of the high-dielectric-constant insulating film (see 15d in FIG. 9C). On film 16A for the gate insulating film, metal containing film 17E whose planar shape is substantially the same as that of high-dielectric-constant insulating film 15Aa is formed. On film 16D for the gate insulating film, metal containing film 17F whose planar shape is substantially the same as that of high-dielectric-constant insulating film 15Dd is formed.

Next, as shown in FIG. 9C, for example, by the CVD method, on semiconductor substrate 11, for example, a silicon film made of polysilicon is formed so as to cover high-dielectric-constant insulating films 15Aa and 15Dd and metal containing films 17E and 17F. The thickness of the silicon film is, for example, about 40 nm to 80 nm. In such a manner, the gate electrode film having metal containing films 17E and 17F and the silicon film is formed.

Subsequently, as shown in FIG. 9C, a resist pattern (not shown) having a gate electrode pattern shape is formed on the silicon film by photolithography. After that, using the resist pattern as a mask, for example, by dry etching, gate electrode film, film 16A for gate insulating film, and film 16D for a gate insulating film are sequentially patterned. The gate electrode film has metal containing films 17E and 17F and the silicon film. Film 16A for the gate insulating film has base film 14A and high-dielectric-constant insulating film 15Aa. Film 16D for the gate insulating film has base film 14B and high-dielectric-constant insulating film 15Dd. After that, the resist pattern is removed. By the operation, gate electrode 19e having metal containing film 17e and silicon film 18e is formed over active region 11a via gate insulating film 16a having base film 14a and high-dielectric-constant insulating film 15a containing the n-type metal for adjustment. Simultaneously, gate electrode 19f having metal containing film 17f and silicon film 18f is formed over active region 11b via gate insulating film 16d having base film 14b and high-dielectric-constant insulating film 15d containing the p-type metal for adjustment.

As understood from FIG. 4B in the first exemplary embodiment, that is, the cross section in the gate length direction, though not shown in FIG. 9C which is the cross section in the gate width direction, both ends in the gate length direction of base film 14A, high-dielectric-constant insulating film 15Aa, and metal containing film 17E are removed. Base film 14a, high-dielectric-constant insulating film 15a, and metal containing film 17e whose width in the gate length direction is smaller than the width in the gate length direction of base film 14A, high-dielectric-constant insulating film 15Aa, and metal containing film 17E are formed. Similarly, both ends in the gate length direction of base film 14B, high-dielectric-constant insulating film 15Dd, and metal containing film 17F are removed. Base film 14b, high-dielectric-constant insulating film 15d, and metal containing film 17f whose width in the gate length direction is smaller than the width in the gate length direction of base film 14B, high-dielectric-constant insulating film 15Dd, and metal containing film 17F are formed.

Next, processes similar to the processes after the processes shown in FIGS. 3C and 4C in the first exemplary embodiment are performed. As a result, offset spacers 20a and 20b, n-type extension region 21a, p-type extension region 21b, sidewalls 24a and 24b, n-type source drain region 25a, and p-type source drain region 25b are formed.

In such a manner, the semiconductor device according to the exemplary embodiment can be manufactured.

By the semiconductor device according to the exemplary embodiment and the method of manufacturing the same, effects similar to those of the second exemplary embodiment can be obtained.

Although the case where the width in the gate width direction of high-dielectric-constant insulating films 15a and 15d and that in the gate width direction of metal containing films 17e and 17f are substantially the same has been described as a concrete example, the present invention is not limited to the case. There is the possibility that the width in the gate width direction of the high-dielectric-constant insulating film and that in the gate width direction of the metal containing film are different from each other due to manufacture variations. Specifically, for example, at the time of patterning metal containing film 17 and high-dielectric-constant insulating films 15A and 15D as shown in FIG. 9B, there is the possibility that the width in the gate width direction of high-dielectric-constant insulating films 15Aa and 15Dd and that in the gate width direction of metal containing films 17E and 17F are different from each other.

As described above, the present invention is useful to the semiconductor device having the n-type MIS transistor provided with the gate insulating film having the high-dielectric-constant insulating film containing the n-type metal for adjustment and the method of manufacturing the semiconductor device in which the threshold voltage of the n-type MIS transistor can be prevented from becoming higher even if gate width becomes narrower.

What is claimed is:

1. A semiconductor device comprising an n-type MIS transistor,
   wherein the n-type MIS transistor includes
      a first active region surrounded by a device isolation region in a semiconductor substrate,
      a first gate insulating film formed on the first active region and the device isolation region, and having a first high-dielectric-constant insulating film containing a first metal for adjustment, and
      a first gate electrode formed on the first gate insulating film,
   the first high-dielectric-constant insulating film has one end protruding on a first device isolation part in the device isolation region adjacent to one end in a gate width direction of the first active region, and one side face in the gate width direction of the first high-dielectric-constant insulating film is positioned on the first device isolation part,
   the first gate electrode has an end protruding above the first device isolation part, and
   a protrusion amount of the one end of the first high-dielectric-constant insulating film on the first device isolation part is smaller than a protrusion amount of the end of the first gate electrode above the first device isolation part.

2. The semiconductor device according to claim 1, wherein the first metal for adjustment is lanthanum.

3. The semiconductor device according to claim 1, wherein the protrusion amount of the one end of the first high-dielectric-constant insulating film on the first device isolation part is in a range between 10 nm and 50 nm, and the protrusion amount of the end of the first gate electrode above the first device isolation part is in a range between 60 nm and 150 nm.

4. The semiconductor device according to claim 1, further comprising a p-type MIS transistor,
   wherein the p-type MIS transistor includes
      a second active region surrounded by the device isolation region in the semiconductor substrate, and provided in a state that a second device isolation part in the device isolation region adjacent to an other end in the gate width direction of the first active region is sandwiched between the first active region and the second active region,
      a second gate insulating film formed on the second active region and the device isolation region, and having a second high-dielectric-constant insulating film containing a second metal for adjustment, and
      a second gate electrode formed on the second gate insulating film, and
   the first and second gate electrodes are connected to each other above the second device isolation part.

5. The semiconductor device according to claim 4, wherein the second metal for adjustment is aluminum.

6. The semiconductor device according to claim 4, wherein the first high-dielectric-constant insulating film has an other end protruding on the second device isolation part, and an other side face in the gate width direction of the first high-dielectric-constant insulating film is positioned on the second device isolation part, and
   a distance from the other end in the gate width direction of the first active region to the other side face in the gate width direction of the first high-dielectric-constant insulating film is smaller than a distance from one end in the gate width direction of the second active region to the other side face in the gate width direction of the first high-dielectric-constant insulating film.

7. The semiconductor device according to claim 6, wherein a protrusion amount of the other end of the first high-dielectric-constant insulating film on the second device isolation part is the same as the protrusion amount of the one end of the first high-dielectric-constant insulating film on the first device isolation part.

8. The semiconductor device according to claim 6, wherein
the second high-dielectric-constant insulating film has a first part,
the first part is formed on the second device isolation part, the second active region, and a third device isolation part in the device isolation region adjacent to an other end in the gate width direction of the second active region, and
the first part is adjacent to the other end of the first high-dielectric-constant insulating film on the second device isolation part.

9. The semiconductor device according to claim 4, wherein
the second high-dielectric-constant insulating film has a second part,
the second part is formed between the first device isolation part and the end of the first gate electrode, and
the second part is adjacent to the one end of the first high-dielectric-constant insulating film on the first device isolation part.

10. The semiconductor device according to claim 4, wherein
the second high-dielectric-constant insulating film has one end protruding on a third device isolation part in the device isolation region adjacent to one end in the gate width direction of the second active region,
the second gate electrode has an end protruding on the third device isolation part, and
a protrusion amount of the one end of the second high-dielectric-constant insulating film on the third device isolation part is smaller than a protrusion amount of the end of the second gate electrode on the third device isolation part.

11. The semiconductor device according to claim 10, wherein
the first high-dielectric-constant insulating film has one end part protruding on the second device isolation part,
the second high-dielectric-constant insulating film has one end part protruding on the second device isolation part adjacent to the other end in the gate width direction of the second active region, and
the end part in the first high-dielectric-constant insulating film and the end part in the second high-dielectric-constant insulating film are apart from each other on the second device isolation part.

12. The semiconductor device according to claim 4, wherein
the first gate electrode has a first metal containing film formed on the first gate insulating film and a first silicon film formed on the first metal containing film,
the second gate electrode has a second metal containing film formed on the second gate insulating film and a second silicon film formed on the second metal containing film, and
the first and second silicon films are connected to each other and integrally formed above the second device isolation part whereas the first and second metal containing films are not connected to each other but are apart from each other above the second device isolation part.

13. The semiconductor device according to claim 1, wherein
the first gate electrode has a metal containing film formed on the first gate insulating film and a silicon film formed on the metal containing film, and
a protrusion amount of an end of the metal containing film above the first device isolation part and a protrusion amount of an end of the silicon film above the first device isolation part are the same.

14. The semiconductor device according to claim 1, wherein
the first gate electrode is formed so as to cover a top face of the first high-dielectric-constant insulating film and the one side face in the gate width direction of the first high-dielectric-constant insulating film, and
the one side face in the gate width direction of the first high-dielectric-constant insulating film is in contact with the first gate electrode.

15. The semiconductor device according to claim 1, wherein
the first gate electrode has a metal containing film formed on the first gate insulating film and a silicon film formed on the metal containing film,
a protrusion amount of an end of the metal containing film above the first device isolation part and a protrusion amount of an end of the silicon film above the first device isolation part are the same,
the metal containing film is formed so as to cover a top face of the first high-dielectric-constant insulating film and the one side face in the gate width direction of the first high-dielectric-constant insulating film, and
the one side face in the gate width direction of the first high-dielectric-constant insulating film is in contact with the metal containing film.

16. The semiconductor device according to claim 1, wherein
the first gate electrode has a metal containing film formed on the first gate insulating film and a silicon film formed on the metal containing film, and
a protrusion amount of an end of the metal containing film above the first device isolation part is smaller than a protrusion amount of an end of the silicon film above the first device isolation part.

17. The semiconductor device according to claim 16, wherein
a protrusion amount of the end of the metal containing film above the first device isolation part and a protrusion amount of the one end of the first high-dielectric-constant insulating film above the first device isolation part are the same.

18. The semiconductor device according to claim 16, wherein
the silicon film is formed so as to cover a top face of the metal containing film, one side face in the gate width direction of the metal containing film positioned above the first device isolation part, and the one side face in the gate width direction of the first high-dielectric-constant insulating film, and
the one side face in the gate width direction of the first high-dielectric-constant insulating film and the one side face in the gate width direction of the metal containing film are in contact with the silicon film.

19. A method of manufacturing a semiconductor device including n-type MIS transistor having a first gate electrode formed above a first active region in a semiconductor substrate via a first gate insulating film, comprising:
a step (a) of forming the first active region surrounded by a device isolation region in the semiconductor substrate;
a step (b) of forming the first gate insulating film having a first high-dielectric-constant insulating film containing a first metal for adjustment, on the first active region and the device isolation region; and
a step (c) of forming the first gate electrode on the first gate insulating film,
wherein in the step (b), the first high-dielectric-constant insulating film has one end protruding on a first device isolation part in the device isolation region adjacent to one end in a gate width direction of the first active region, in the step (c), the first gate electrode has an end protruding above the first device isolation part, and a protrusion amount of the one end of the first high-dielectric-constant insulating film on the first device isolation part is smaller than a protrusion amount of the end of the first gate electrode above the first device isolation part.

20. The method of manufacturing a semiconductor device according to claim 19, wherein the semiconductor device further comprises a p-type MIS transistor having a second gate electrode formed above a second active region in the semiconductor substrate via a second gate insulating film, the step (a) includes a step of forming the second active region surrounded by the device isolation region in the semiconductor substrate and provided in a state that a second device isolation part in the device isolation region adjacent to an other end in the gate width direction of the first active region is sandwiched between the first active region and the second active region, the step (b) includes a step of forming the second gate insulating film having a second high-dielectric-constant insulating film containing a second metal for adjustment, on the second active region and the device isolation region, the step (c) includes a step of forming the second gate electrode on the second gate insulating film, and in the step (c), the first and second gate electrodes are connected to each other above the second device isolation part.

* * * * *